(12) United States Patent
Song

(10) Patent No.: US 11,315,611 B2
(45) Date of Patent: Apr. 26, 2022

(54) PROCESSING-IN-MEMORY (PIM) SYSTEM AND OPERATING METHODS OF THE PIM SYSTEM

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/143,886

(22) Filed: Jan. 7, 2021

(65) Prior Publication Data

US 2021/0210123 A1 Jul. 8, 2021

Related U.S. Application Data

(63) Continuation-in-part of application No. 17/027,276, filed on Sep. 21, 2020.

(60) Provisional application No. 62/959,634, filed on Jan. 10, 2020, provisional application No. 62/958,226, filed on Jan. 7, 2020.

(30) Foreign Application Priority Data

Jan. 17, 2020 (KR) .................. 10-2020-0006903

(51) Int. Cl.
*G11C 7/10* (2006.01)
*H03K 19/00* (2006.01)
*H03K 19/173* (2006.01)

(52) U.S. Cl.
CPC .......... *G11C 7/1006* (2013.01); *G11C 7/1057* (2013.01); *G11C 7/1084* (2013.01); *H03K 19/0002* (2013.01); *H03K 19/1733* (2013.01)

(58) Field of Classification Search
CPC ................................ G11C 7/1006; G11C 7/10
USPC ..................................................... 365/189.05
See application file for complete search history.

(56) References Cited

U.S. PATENT DOCUMENTS

| | | | |
|---|---|---|---|
| 5,033,027 A | 7/1991 | Amin | |
| 5,799,209 A * | 8/1998 | Chatter | ............... G11C 7/1075 710/56 |
| 8,572,311 B1 | 10/2013 | Shalvi et al. | |
| 10,042,639 B2 | 8/2018 | Gopal et al. | |

(Continued)

FOREIGN PATENT DOCUMENTS

| KR | 1020190030579 A | 3/2019 |
|---|---|---|
| KR | 1020190091097 A | 8/2019 |

*Primary Examiner* — Muna A Techane
(74) *Attorney, Agent, or Firm* — William Park & Associates Ltd.

(57) ABSTRACT

A memory system includes a stacked memory device and a controller. The stacked memory device includes a base die and a plurality of memory dies stacked on the base die. Each of the plurality of memory dies has a plurality of channels, and the base die is configured to function as an interface for transmitting signals and data of the pluralities of channels. The controller controls the stacked memory device such that first and second data move control operations are sequentially performed to transmit moving data from a target channel of the pluralities of channels to a destination channel of the pluralities of channels. The first data move control operation is performed to store the moving data in the target channel into the base die, and the second data move control operation is performed to write the moving data stored in the base die into the destination channel.

24 Claims, 45 Drawing Sheets

(56) References Cited

U.S. PATENT DOCUMENTS

| | | | |
|---|---|---|---|
| 2012/0079352 A1* | 3/2012 | Frost .................... | G06F 3/0679 |
| | | | 714/767 |
| 2012/0303878 A1 | 11/2012 | Haas et al. | |
| 2016/0179376 A1 | 6/2016 | Ramalingam | |
| 2018/0226108 A1* | 8/2018 | Kwon .................. | G11C 7/1012 |

* cited by examiner

FIG.41

| QUEUE | CONTROL SIGNALS FROM COMMAND GENERATOR | DATA FROM/TO DATA BUFFER |
|---|---|---|
| RD_Q0 | CMD_R / ADDR_00 | DA_R |
| WT_Q0 | CMD_W / ADDR_10 | DA_W |
| RD_Q1 | CMD_RM / ADDR_01 / ID_01 | |
| WT_Q1 | CMD_WM / ADDR_11 / ID_01 | |

PROCESSING-IN-MEMORY (PIM) SYSTEM AND OPERATING METHODS OF THE PIM SYSTEM

CROSS-REFERENCE TO RELATED APPLICATIONS

This is a continuation-in-part of U.S. patent application Ser. No. 17/027,276, filed Sep. 21, 2020, which claims the priority of provisional application No. 62/958,226, filed on Jan. 7, 2020, and Korean Application No. 10-2020-0006903, filed on Jan. 17, 2020, which are incorporated herein by reference in their entirety. This application claims the provisional application No. 62/959,634, filed on Jan. 10, 2020, which is incorporated herein by reference in its entirety.

BACKGROUND

1. Technical Field

Various embodiments of the present disclosure relate to processing-in-memory (PIM) systems and, more particularly, to PIM systems including a PIM device and a controller and methods of operating the PIM systems.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

According to an embodiment of the present disclosure, a memory system includes a stacked memory device and a controller. The stacked memory device includes a base die and a plurality of memory dies stacked on the base die. Each of the plurality of memory dies has a plurality of channels, and the base die is configured to function as an interface for transmitting signals and data of a multiplicity of channels including the plurality of channels for each of the memory dies. The controller is configured to control the stacked memory device such that a first data move control operation and a second data move control operation are sequentially performed in the stacked memory device to transmit moving data from a target channel of the multiplicity of channels to a destination channel of the multiplicity of channels. The first data move control operation is performed to store the moving data in the target channel into the base die, and the second data move control operation is performed to write the moving data stored in the base die into the destination channel.

BRIEF DESCRIPTION OF THE DRAWINGS

Certain features of the disclosed technology are illustrated in various embodiments with reference to the attached drawings.

FIG. 41 is a table illustrating control signals outputted from a command generator included in a controller of the memory system illustrated in FIG. 31 according to queues generated in the controller and illustrating a data storage operation of a data buffer included in the controller.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
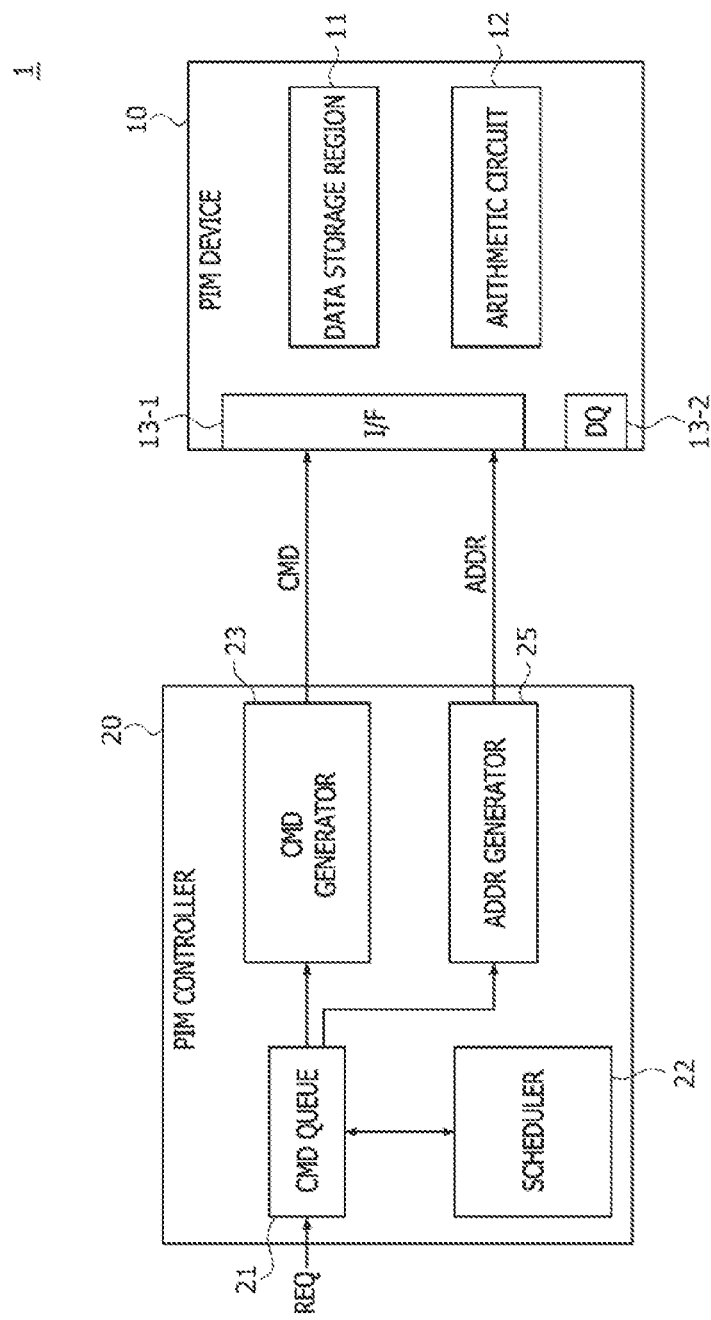
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data outputted from the host or the PIM controller 20 may be inputted into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is outputted from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD outputted from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR outputted from the address generator 25 may be inputted to the data storage region 11 through the interface (I/F) 13-1.

Figure 2:
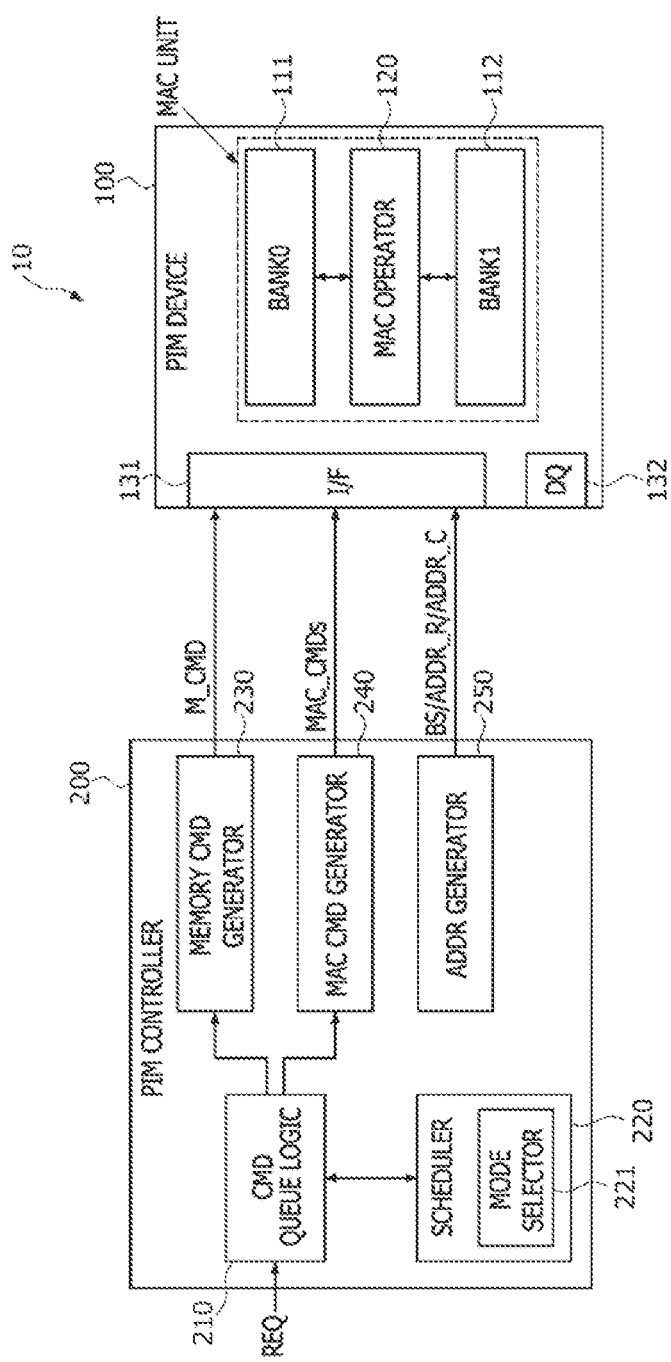
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/ column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data outputted from the host or the PIM controller 200 may be inputted into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue outputted from the command queue logic 210 includes command information requesting an operation in the memory mode of the PIM device 100, the command queue logic 210 may transmit the command queue to the memory command generator 230. On the other hand, when the command queue outputted from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is outputted from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue outputted from the command queue logic 210 relates to the memory mode of the PIM device 100 or relates to the MAC mode of the PIM device 100. In order to obtain the information on whether the command queue outputted from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD outputted from the memory command generator 230 may be transmitted to the PIM device 100. In an embodiment, the memory command M_CMD may include a memory read command and a memory write command. When the memory read command is outputted from the memory command generator 230, the PIM device 100 may perform the data read operation for the first memory bank 111 or the second memory bank 112. Data which are read out of the PIM device 100 may be transmitted to an external device through the data I/O pad 132. The read data outputted from the PIM device 100 may be transmitted to a host through the PIM controller 200. When the memory write command is outputted from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data inputted to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs outputted from the MAC command generator 240 may be transmitted to the PIM device 100. The data read operation for the first memory bank 111 and the second memory bank 112 of the PIM device 100 may be performed by the MAC commands MAC_CMDs outputted from the MAC command generator 240, and the MAC arithmetic operation of the MAC operator 120 may also be performed by the MAC commands MAC_CMDs outputted from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
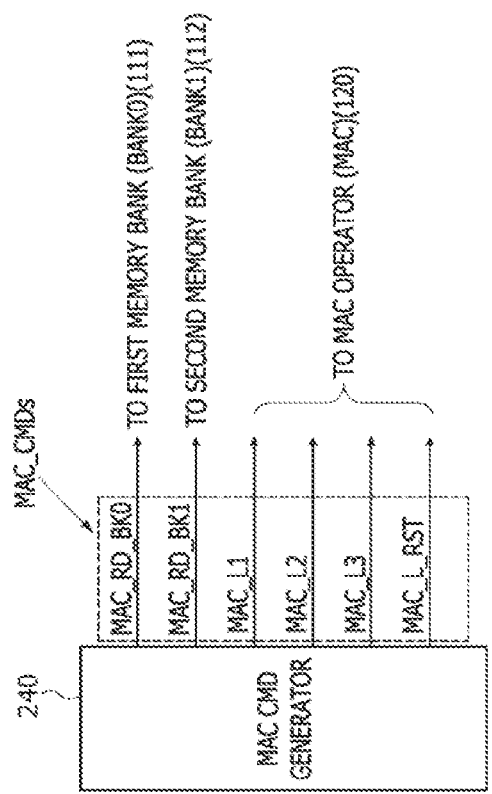
FIG. 3 illustrates MAC commands outputted from a MAC command generator of a PIM controller included in a PIM system according to a first embodiment of the present disclosure.

FIG. 3 illustrates the MAC commands MAC_CMDs outputted from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
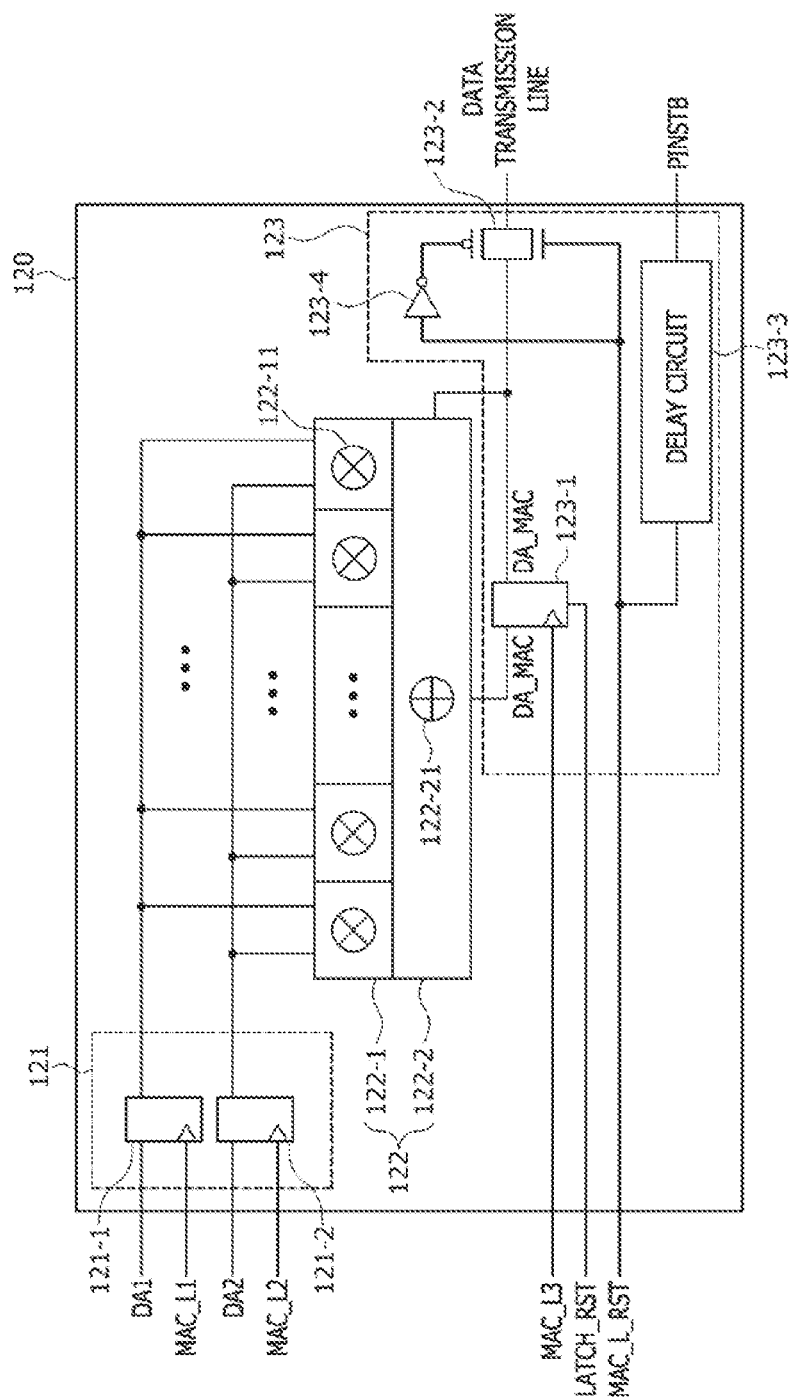
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input 10 circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be inputted to the MAC circuit 122 of the MAC operator 120 after the first data DA1 is inputted to the MAC circuit 122 of the MAC operator 120.

The MAC circuit 122 may perform the MAC arithmetic operation of the first data DA1 and the second data DA2 inputted through the data input circuit 121. The multiplication logic circuit 122-1 of the MAC circuit 122 may include a plurality of multipliers 122-11. Each of the multipliers 122-11 may perform a multiplying calculation of the first data DA1 outputted from the first input latch 121-1 and the second data DA2 outputted from the second input latch 121-2 and may output the result of the multiplying calculation. Bit values constituting the first data DA1 may be separately inputted to the multipliers 122-11. Similarly, bit values constituting the second data DA2 may also be separately inputted to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be inputted to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC outputted from the adder 122-21 disposed at the last stage and previous MAC result data DA_MAC stored in the output latch 123-1 of the data output circuit 123.

The data output circuit 123 may output the MAC result data DA_MAC outputted from the MAC circuit 122 to a data transmission line. Specifically, the output latch 123-1 of the data output circuit 123 may be synchronized with the MAC output latch signal MAC_L3 to latch the MAC result data DA_MAC outputted from the MAC circuit 122 and to output the latched data of the MAC result data DA_MAC. The MAC result data DA_MAC outputted from the output latch 123-1 may be fed back to the MAC circuit 122 for the accumulative adding calculation. In addition, the MAC result data DA_MAC may be inputted to the transfer gate 123-2. The output latch 123-1 may be initialized if a latch reset signal LATCH_RST is inputted to the output latch 123-1. In such a case, all of data latched by the output latch 123-1 may be removed. In an embodiment, the latch reset signal LATCH_RST may be activated by generation of the MAC latch reset signal MAC_L_RST and may be inputted to the output latch 123-1.

The MAC latch reset signal MAC_L_RST outputted from the MAC command generator 240 may be inputted to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

Figure 5:
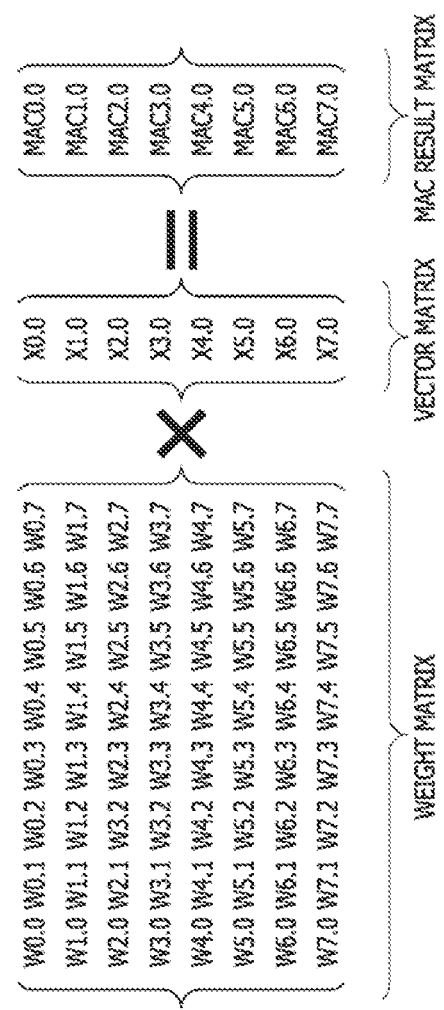
FIG. 5 illustrates an example of a MAC arithmetic operation performed in a PIM system according to a first embodiment of the present disclosure.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 inputted to the MAC operator 120 from the first memory bank 111. Elements X0.0, . . . , and X7.0 constituting the vector matrix may correspond to the second data DA2 inputted to the MAC operator 120 from the second memory bank 112. Each of the elements W0.0, . . . , and W7.7 constituting the weight matrix may be represented by a binary stream having a plurality of bit values. In addition, each of the elements X0.0, . . . , and X7.0 constituting the vector matrix may also be represented by a binary stream having a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data inputted to the first hidden layer. However, in each of second to last hidden layers among the plurality of hidden layers, the MAC arithmetic operation may be performed using a calculation result of the previous hidden layer as the vector data.

Figure 6:
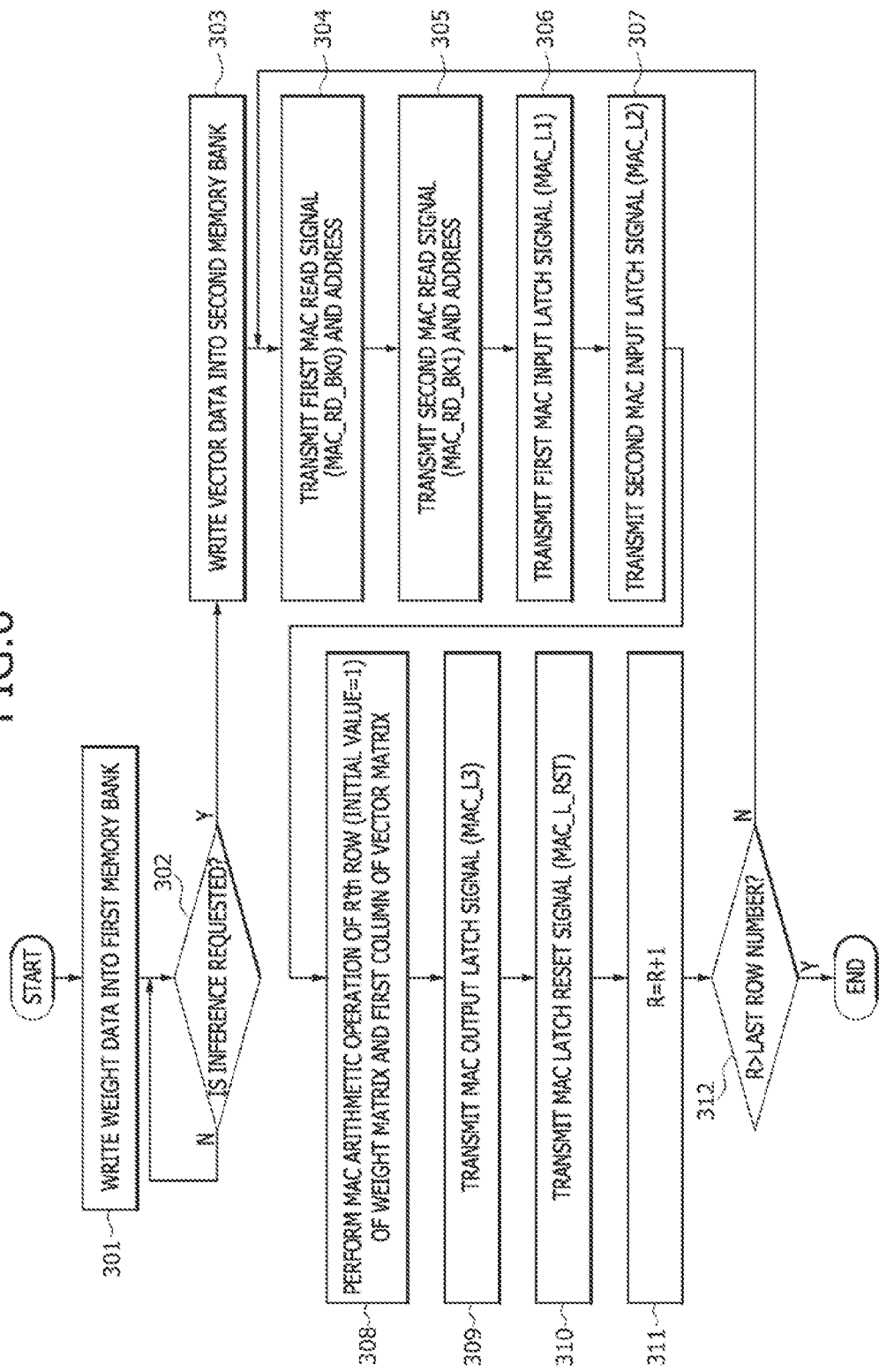
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
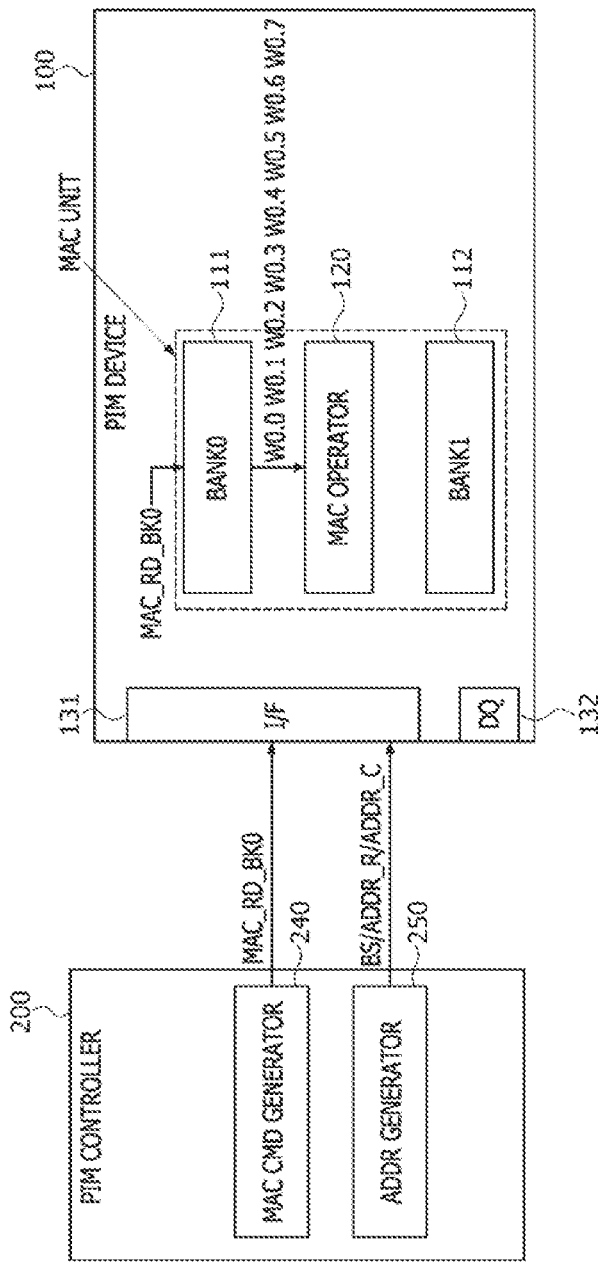
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
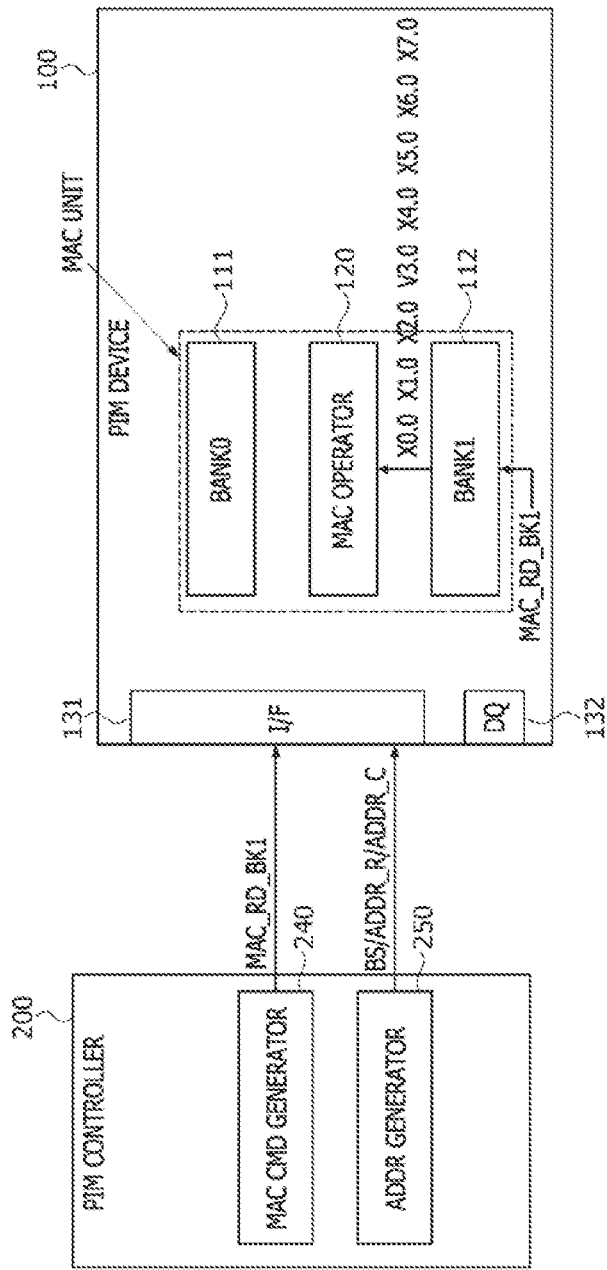

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
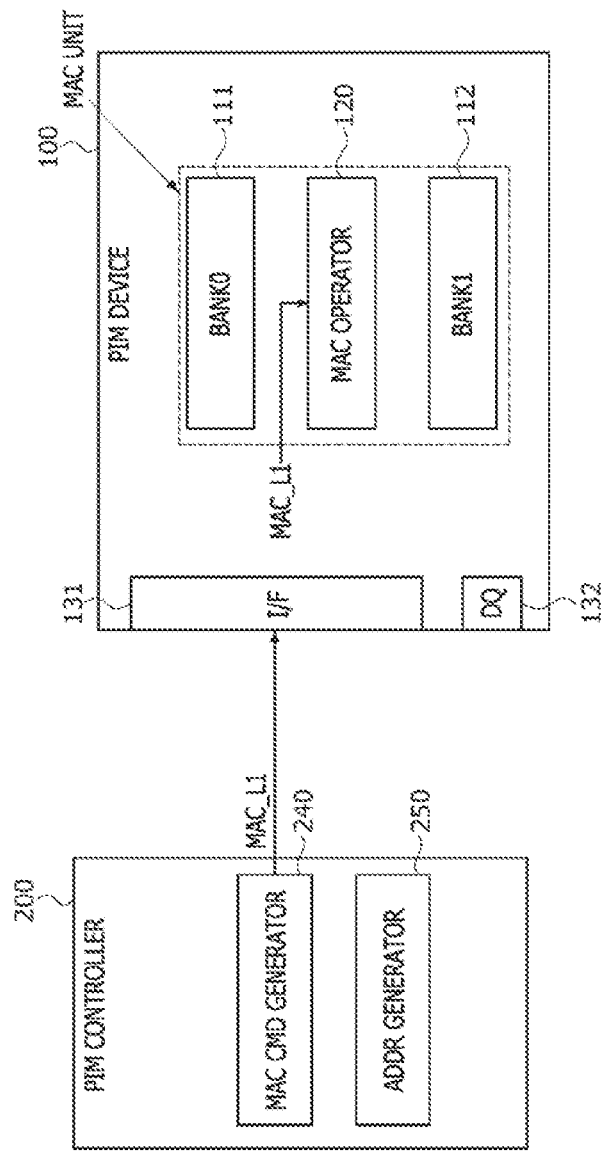
Figure 11:
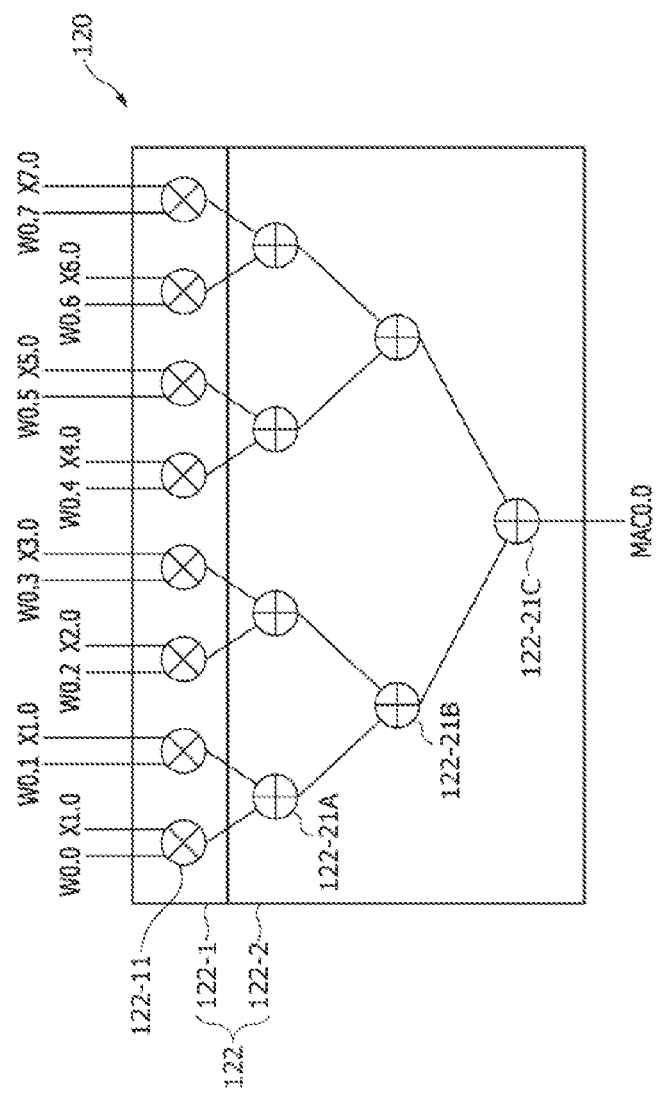

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be inputted to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be inputted to the eight multipliers 122-11, respectively.

Figure 10:
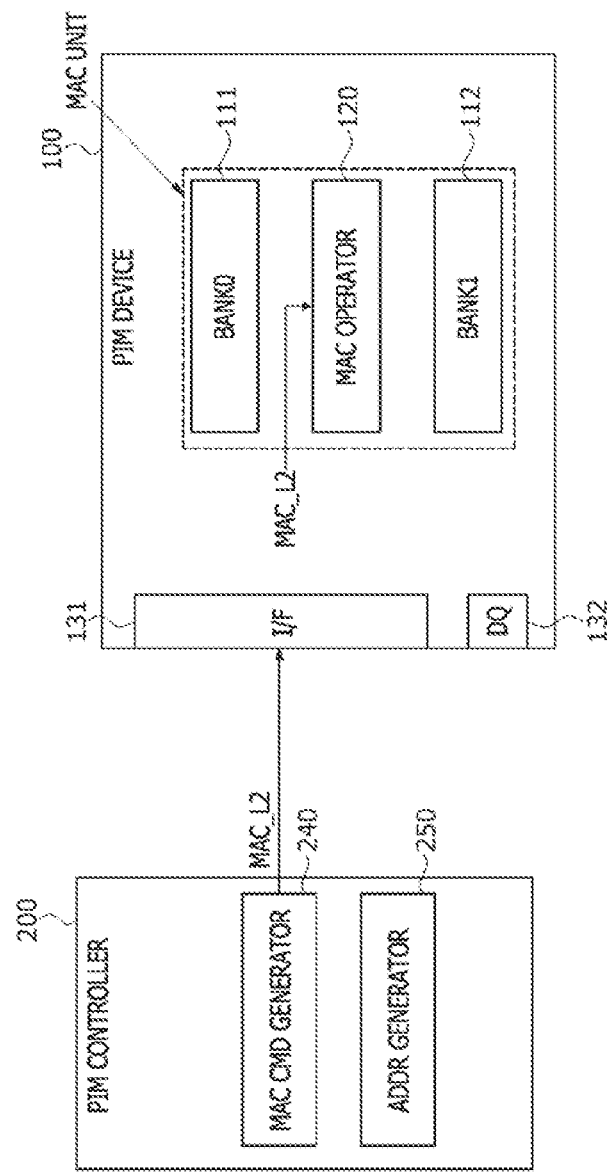

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be inputted to the MAC circuit 122 of the MAC operator 120 by the input latch operation, as illustrated in FIG. 11. In such a case, the elements X0.0, . . . , and X7.0 in the first column of the vector matrix may be inputted to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+ W0.3*X3.0+W0.4*X4.0+W0.5*X5.0+W0.6*X6.0+ W0.7*X7.0. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2, as illustrated in FIG. 11, may include four adders 122-21A disposed at a first stage, two adders 122-21B disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix having eight elements of MAC0.0, . . . , and MAC7.0, as illustrated in FIG. 5. The output data MAC0.0 of the addition logic circuit 122-2 may be inputted to the output latch 123-1 disposed in the data output circuit 123 of the MAC operator 120, as described with reference to FIG. 4.

Figure 12:
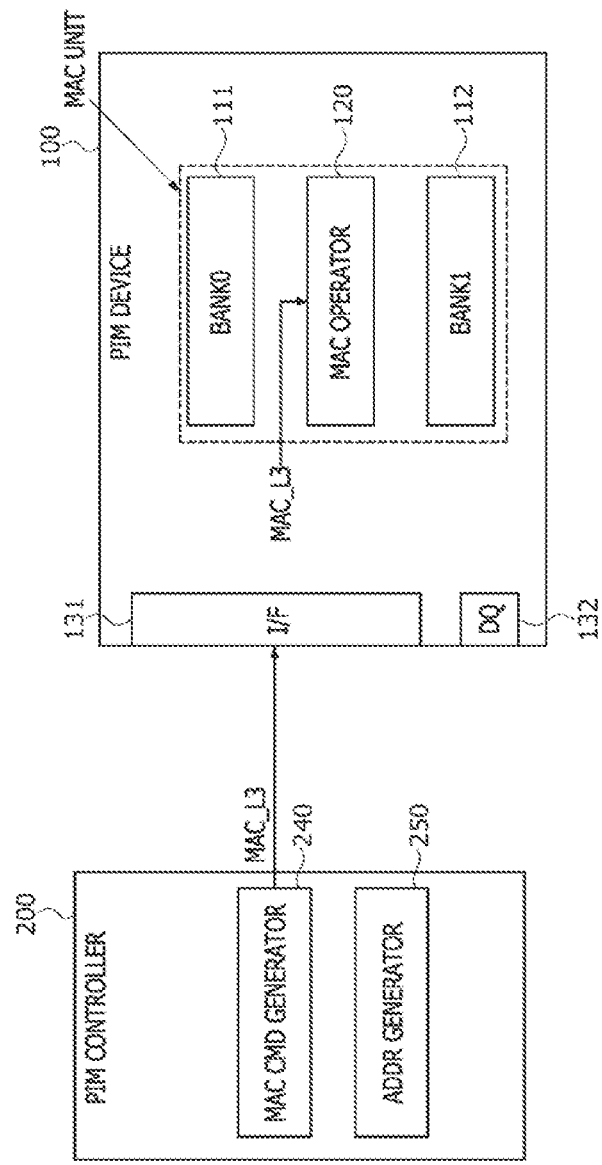

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 inputted from the MAC circuit 122 of the MAC operator 120 may be outputted from the output latch 123-1 in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 13:
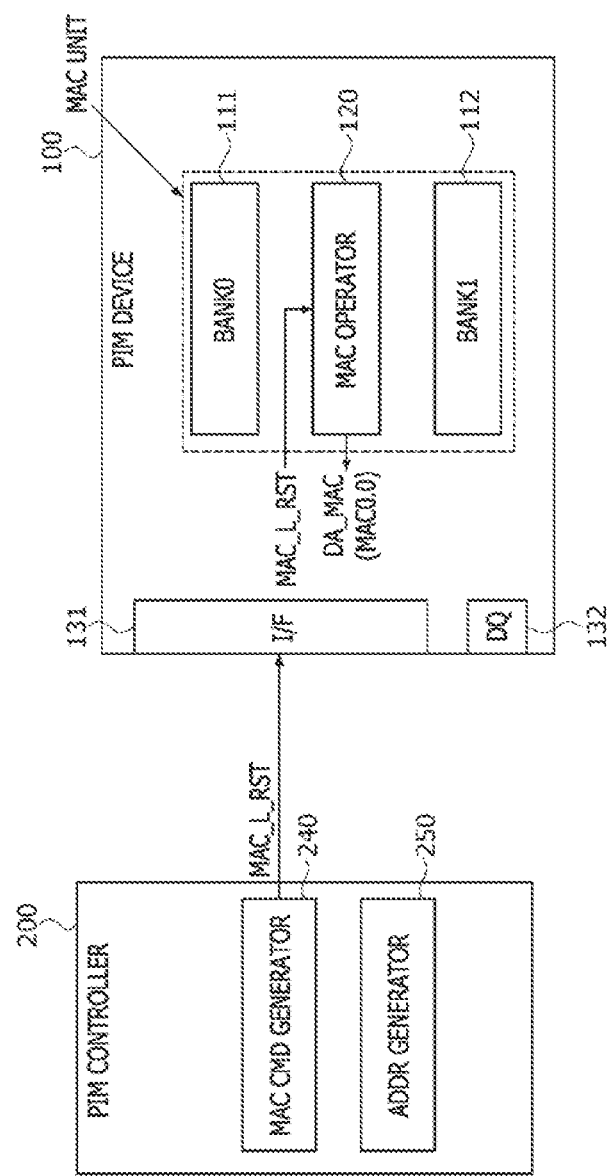

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 outputted from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
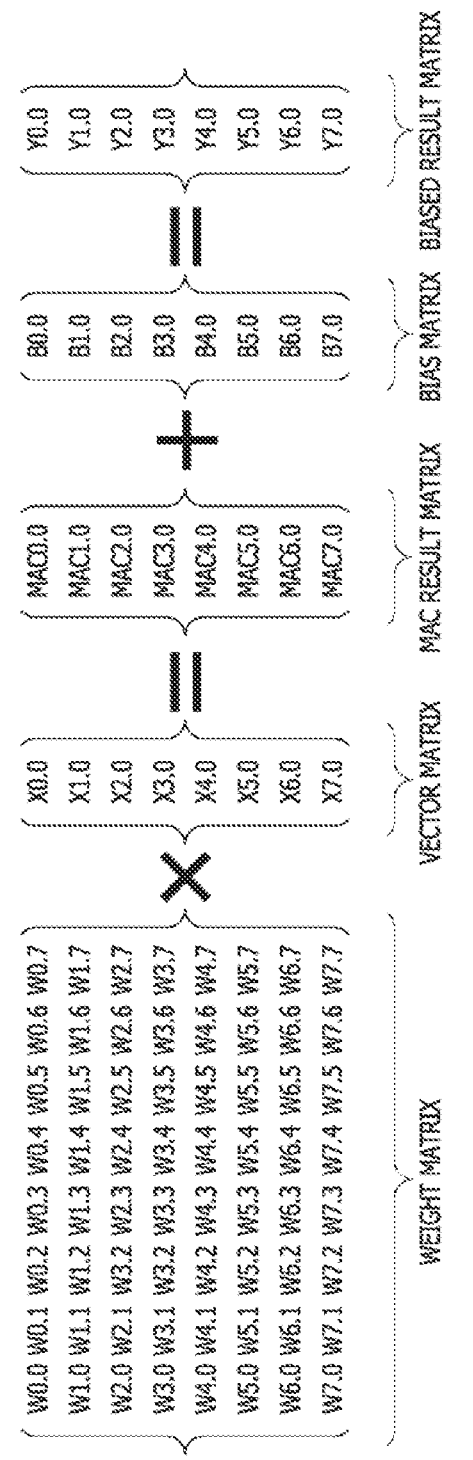
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix having the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix having eight elements Y0.0, . . . , and Y7.0 may be generated.

Figure 15:
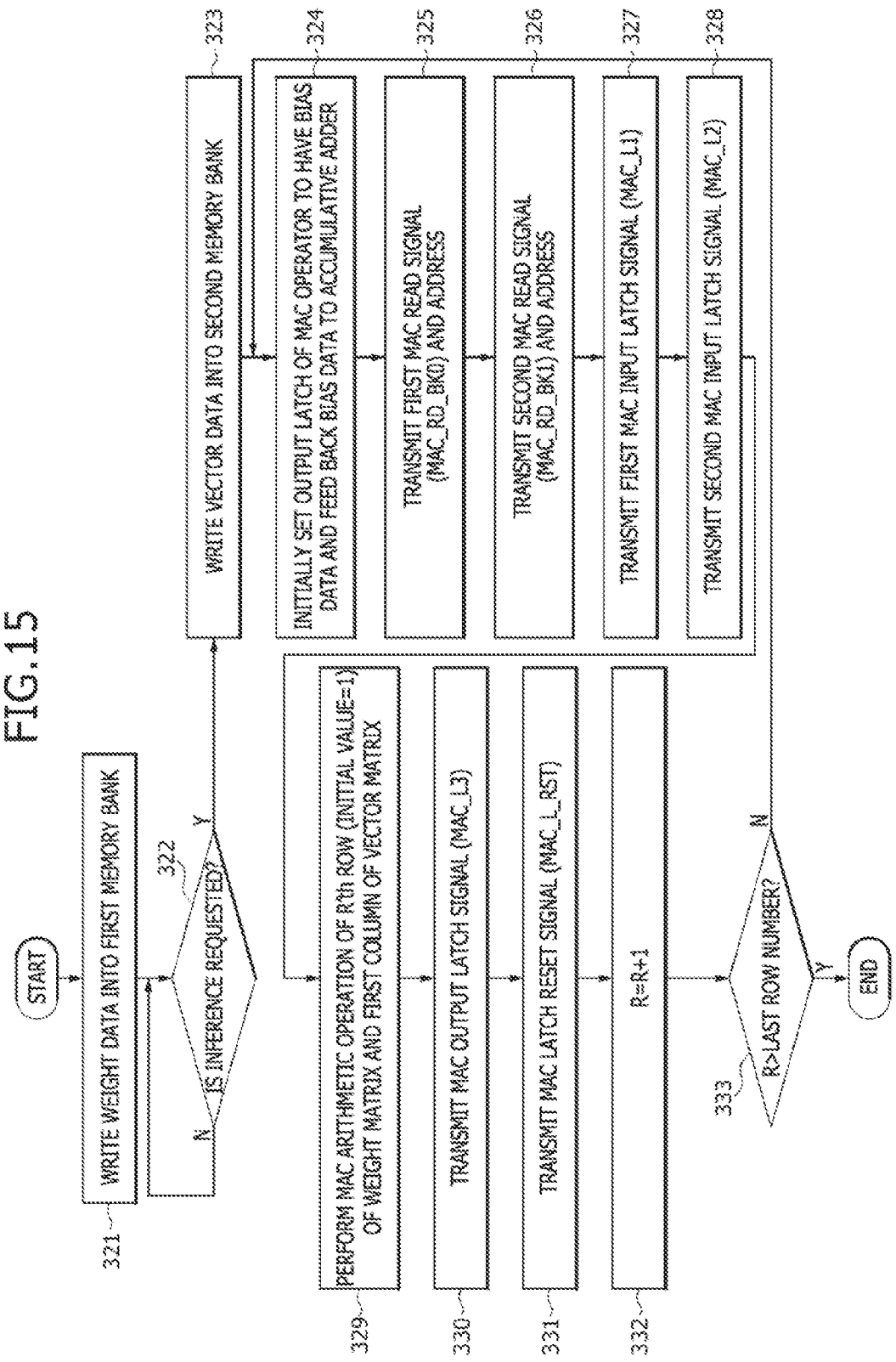
FIG. 15 is a flowchart illustrating processes of the MAC arithmetic operation illustrated in FIG. 14 in a PIM system according to a first embodiment of the present disclosure.
Figure 16:
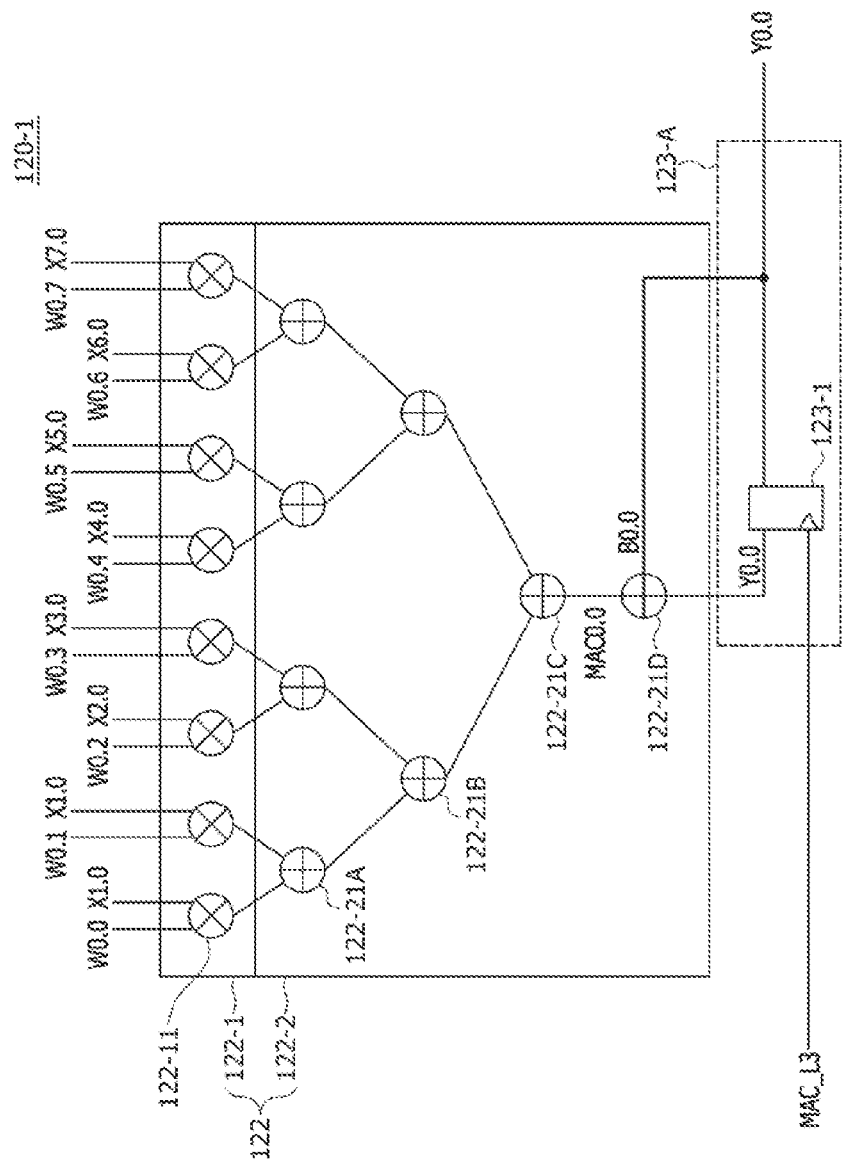
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 outputted from the output latch 123-1 may be inputted to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123 may be inputted to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 outputted from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
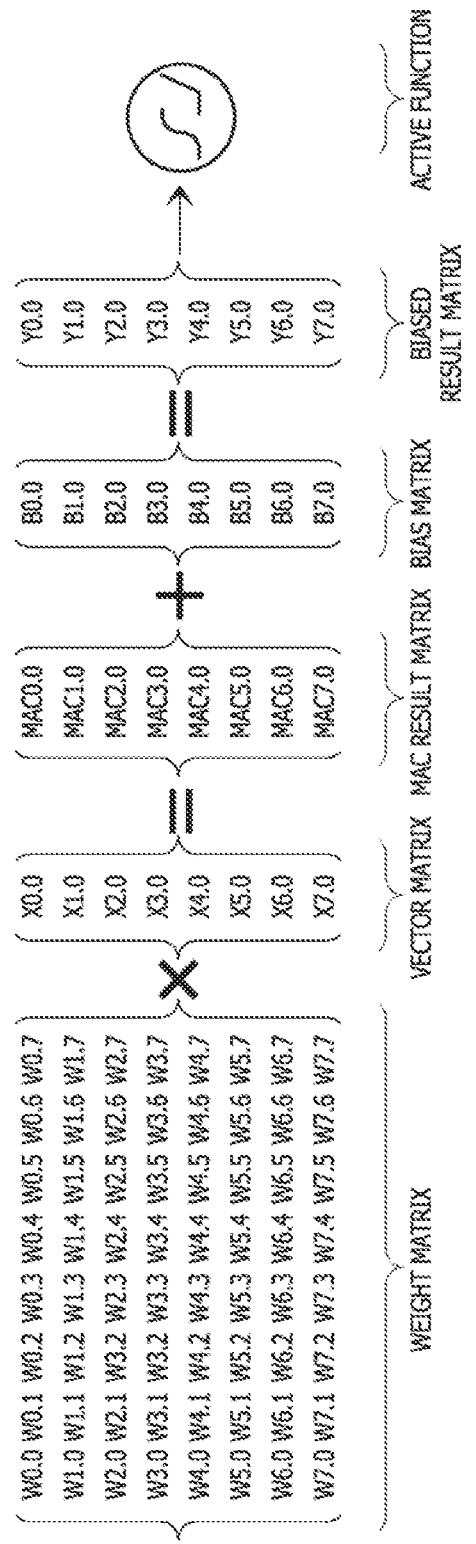
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tanh) function, a rectified linear unit (ReLU) function, a leaky ReLU function, an identity function, and a maxout function.

Figure 18:
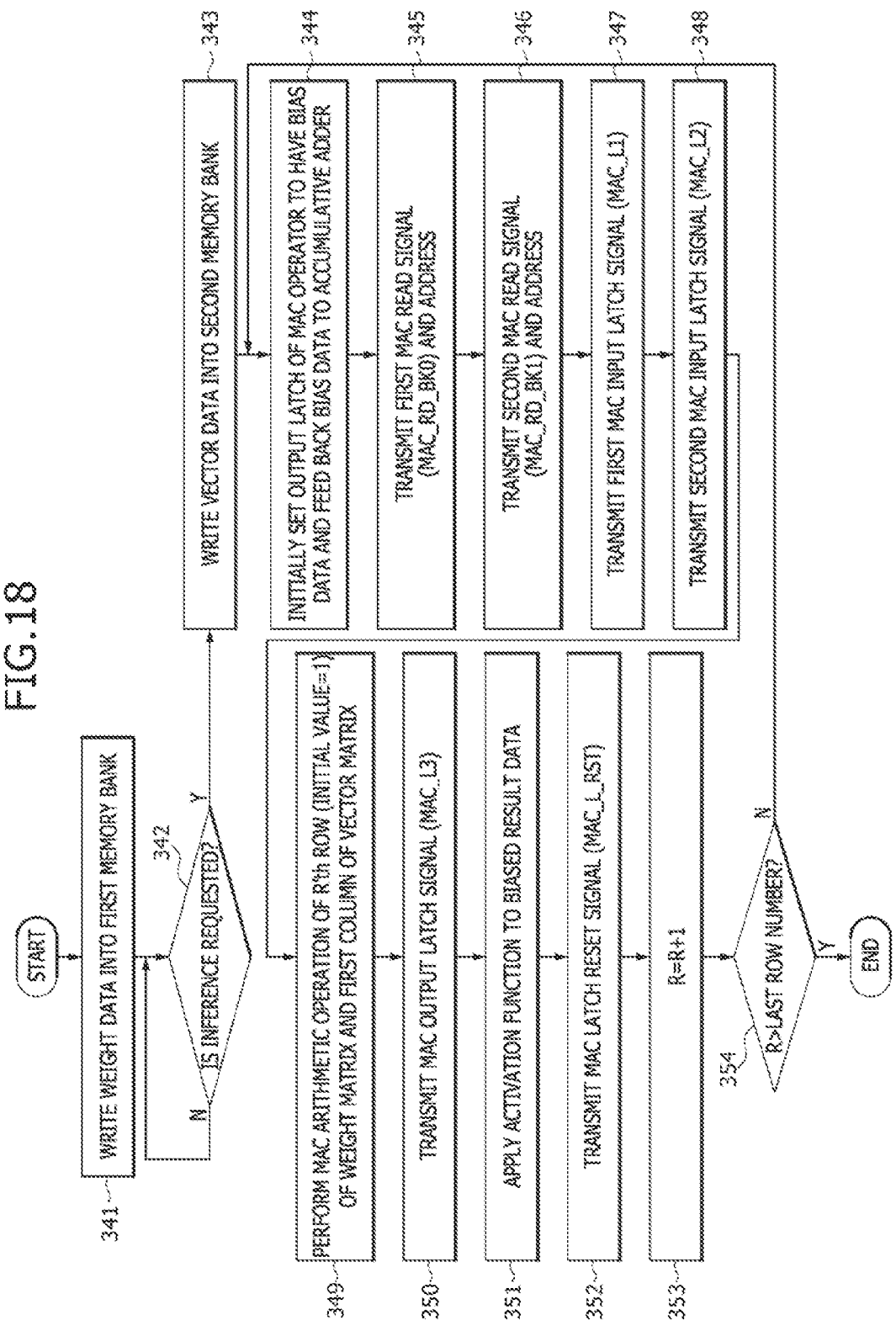
FIG. 18 is a flowchart illustrating processes of the MAC arithmetic operation illustrated in FIG. 17 in a PIM system according to a first embodiment of the present disclosure.
Figure 19:
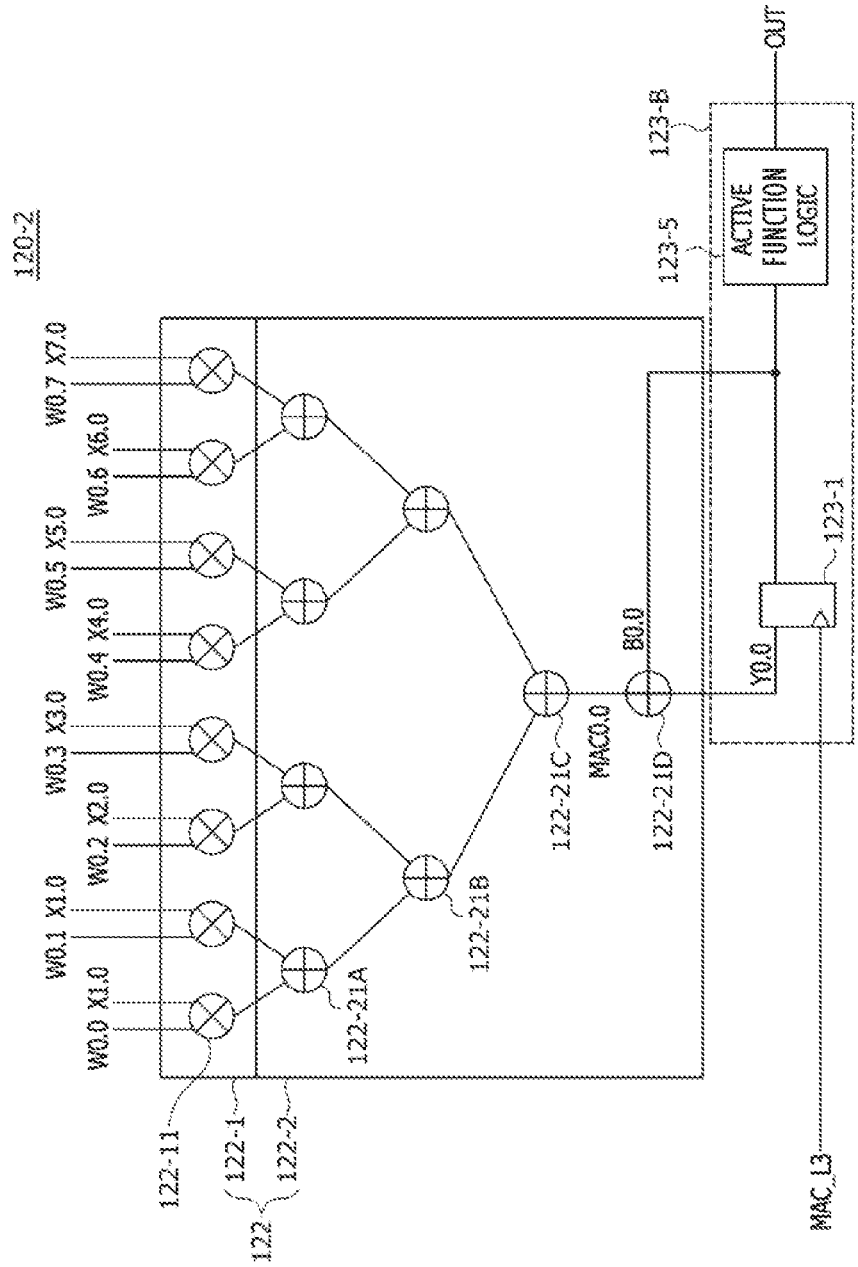
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123-1 may be inputted to the activation function logic circuit 123-5. At a step 351, the activation function logic circuit 123-5 may apply an activation function to the biased result data Y0.0 to generate a final output value, and the final output value may be inputted to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value outputted from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
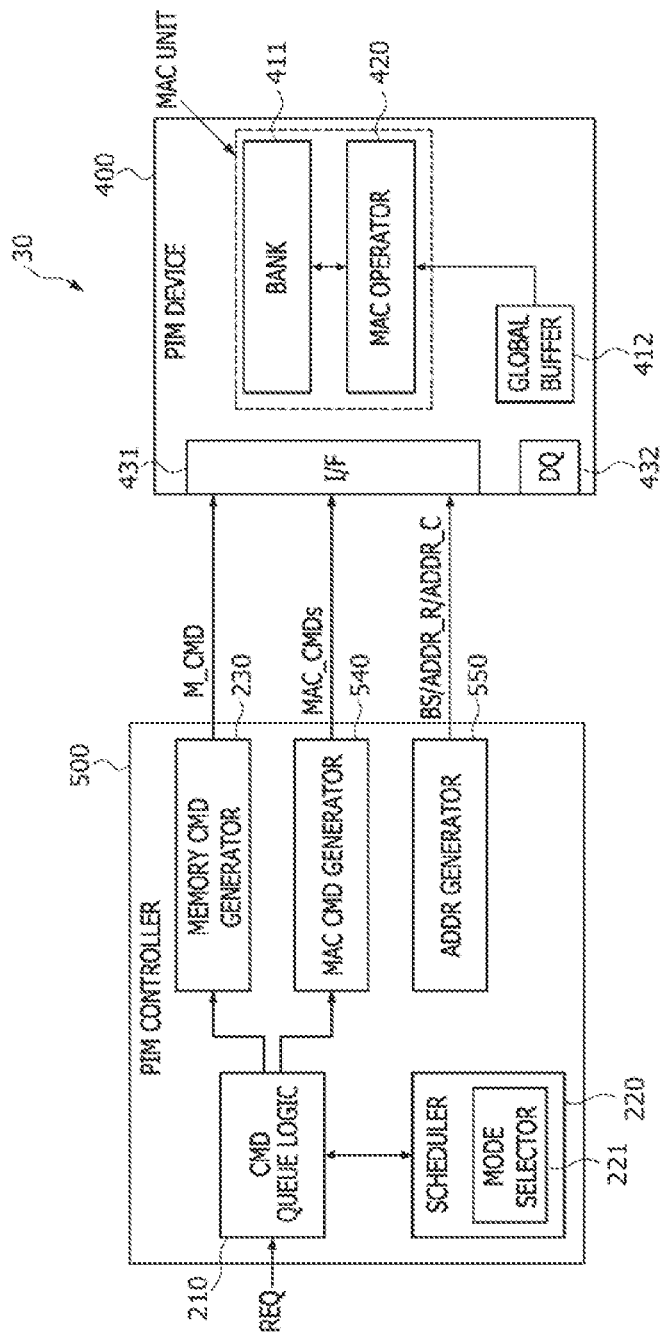
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously inputted to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously inputted to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously inputted to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously inputted to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously inputted to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data outputted from the host or the PIM controller 500 may be inputted into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is outputted from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs outputted from the MAC command generator 540 may be transmitted to the PIM device 400. The data read operation for the memory bank 411 of the PIM device 400 may be performed by the MAC commands MAC_CMDs outputted from the MAC command generator 540, and the MAC arithmetic operation of the MAC operator 420 may also be performed by the MAC commands MAC_CMDs outputted from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
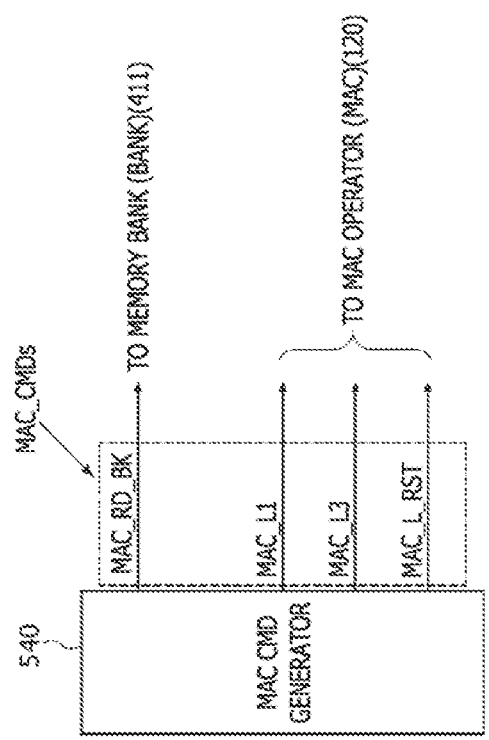
FIG. 21 illustrates MAC commands outputted from a MAC command generator of a PIM controller included in a PIM system according to a second embodiment of the present disclosure.

FIG. 21 illustrates the MAC commands MAC_CMDs outputted from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 500 with fixed time intervals corresponding to the fixed latencies.

Figure 22:
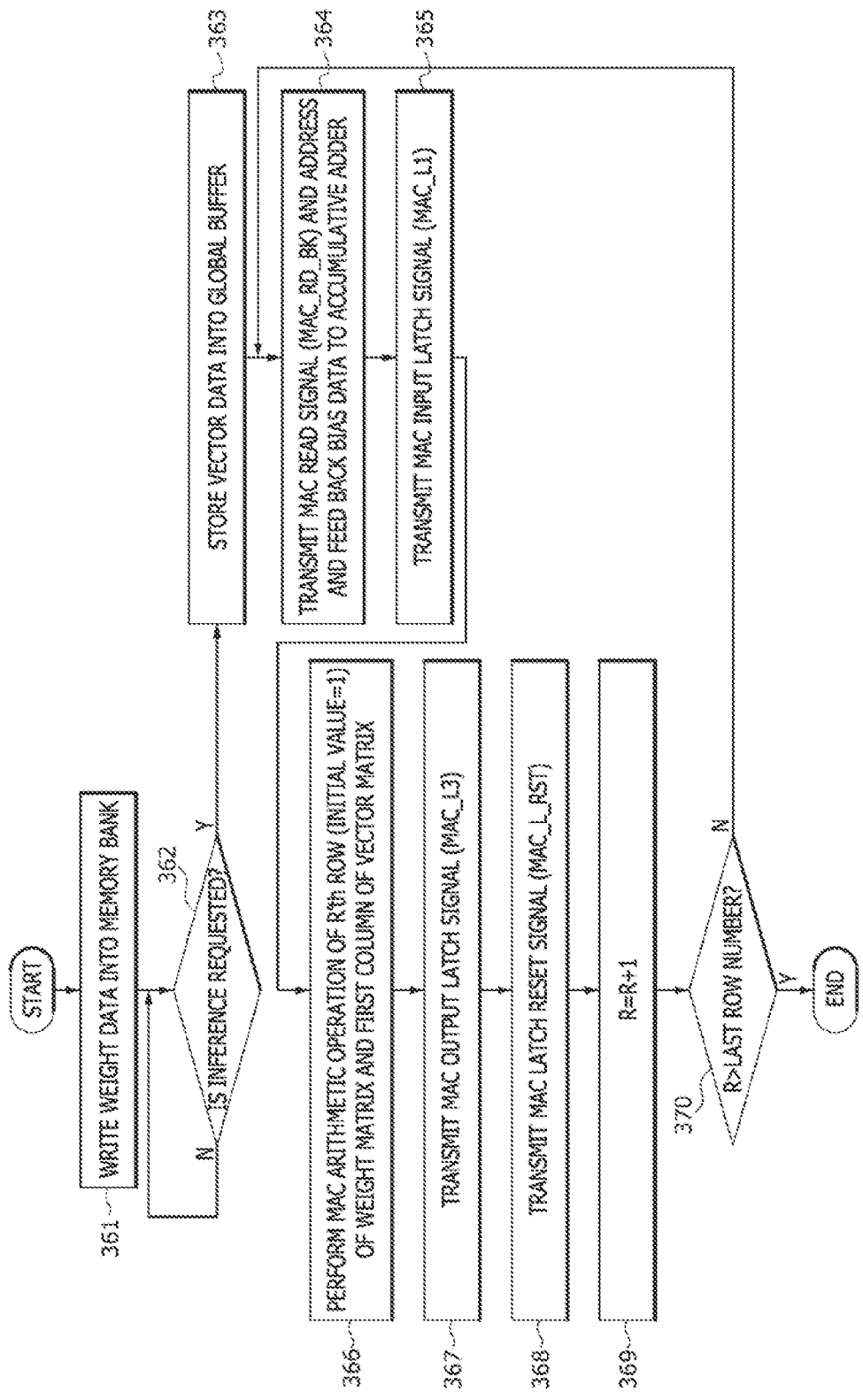
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
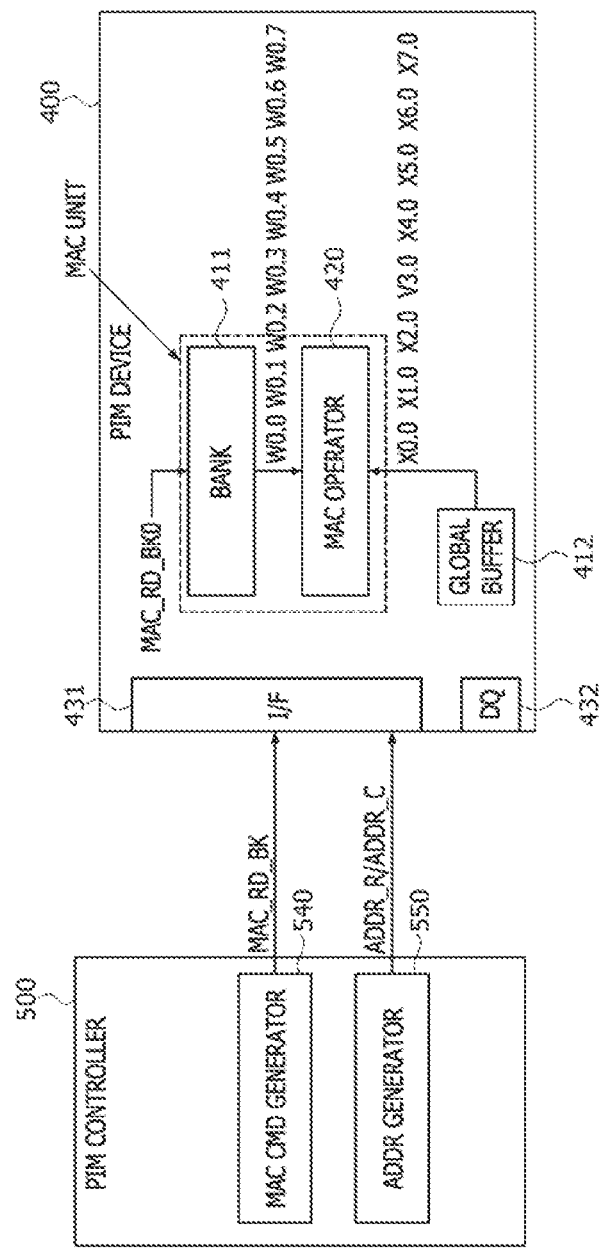
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
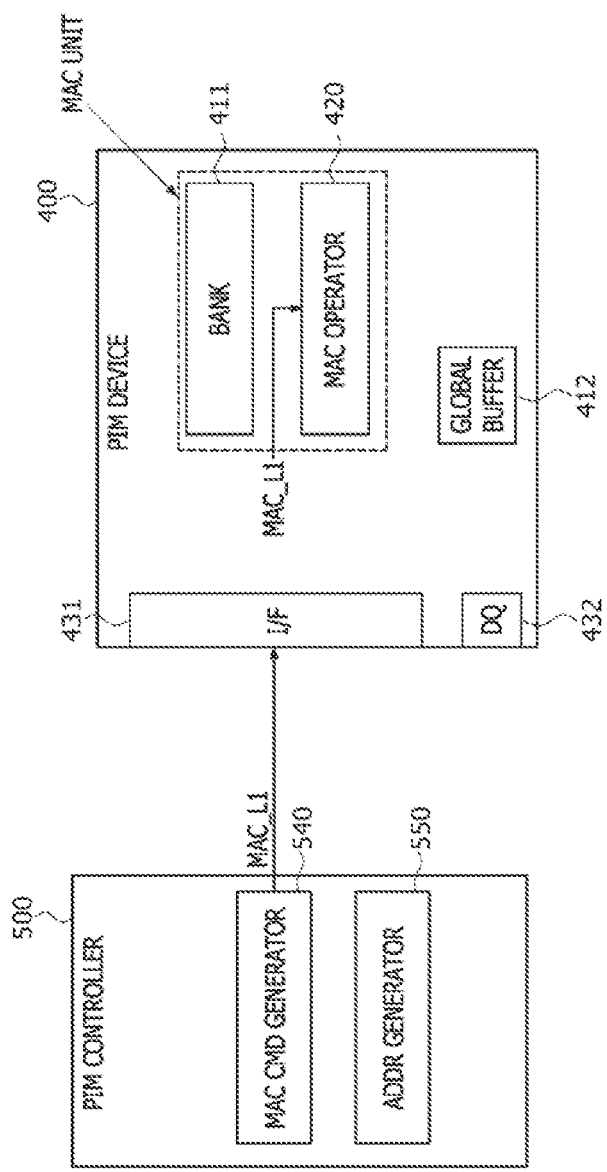

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix having the eight elements of MAC0.0, . . . , and MAC7.0 illustrated in FIG. 5. The output data MAC0.0 of the addition logic circuit 122-2 may be inputted to the output latch 123-1 disposed in the data output circuit 123 of the MAC operator 420, as described with reference to FIG. 4.

Figure 25:
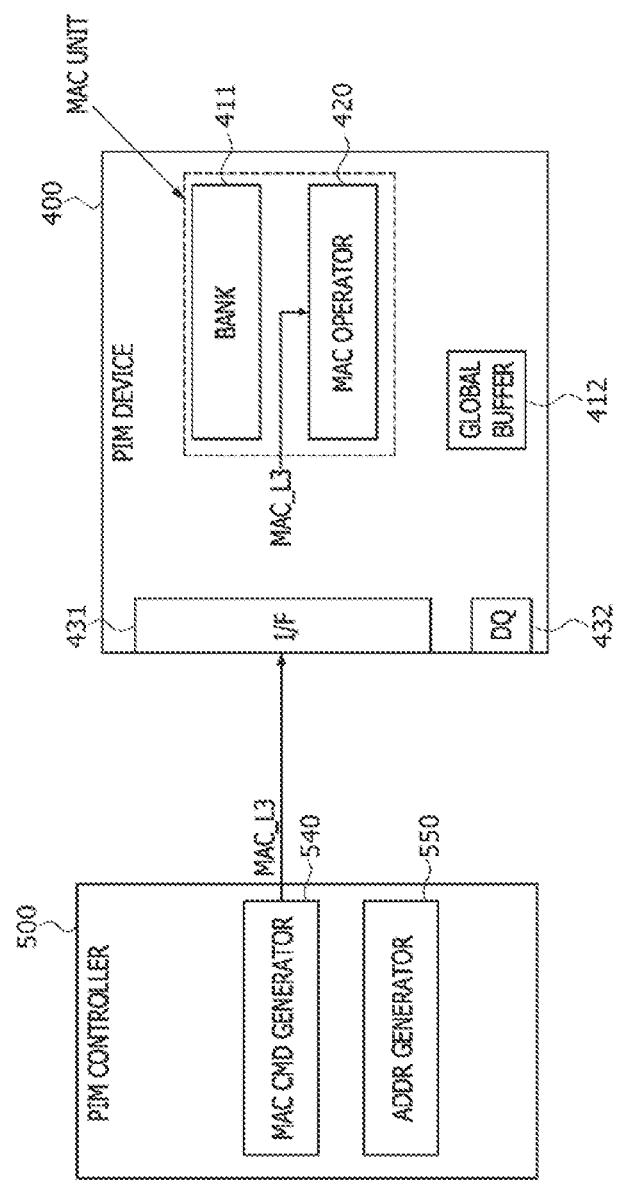

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be outputted from the output latch 123-1 by the output latch operation performed in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 26:
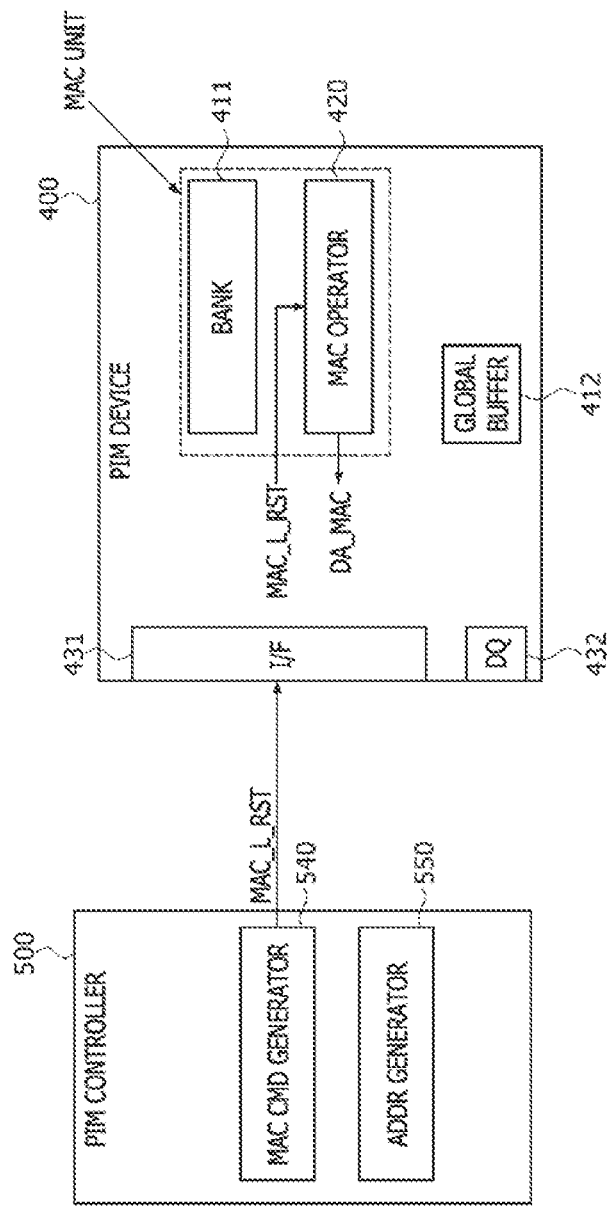

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 outputted from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
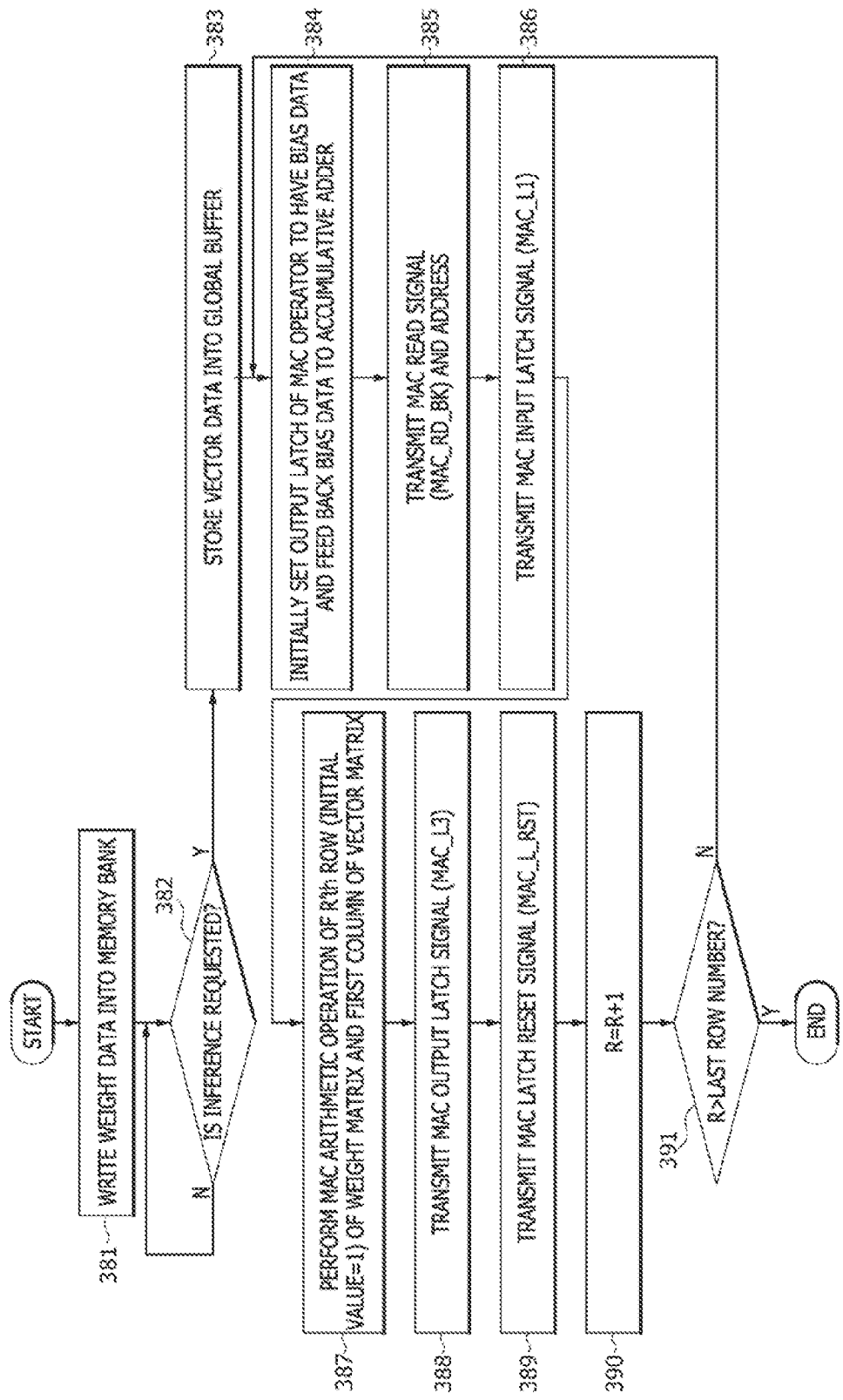
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 outputted from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
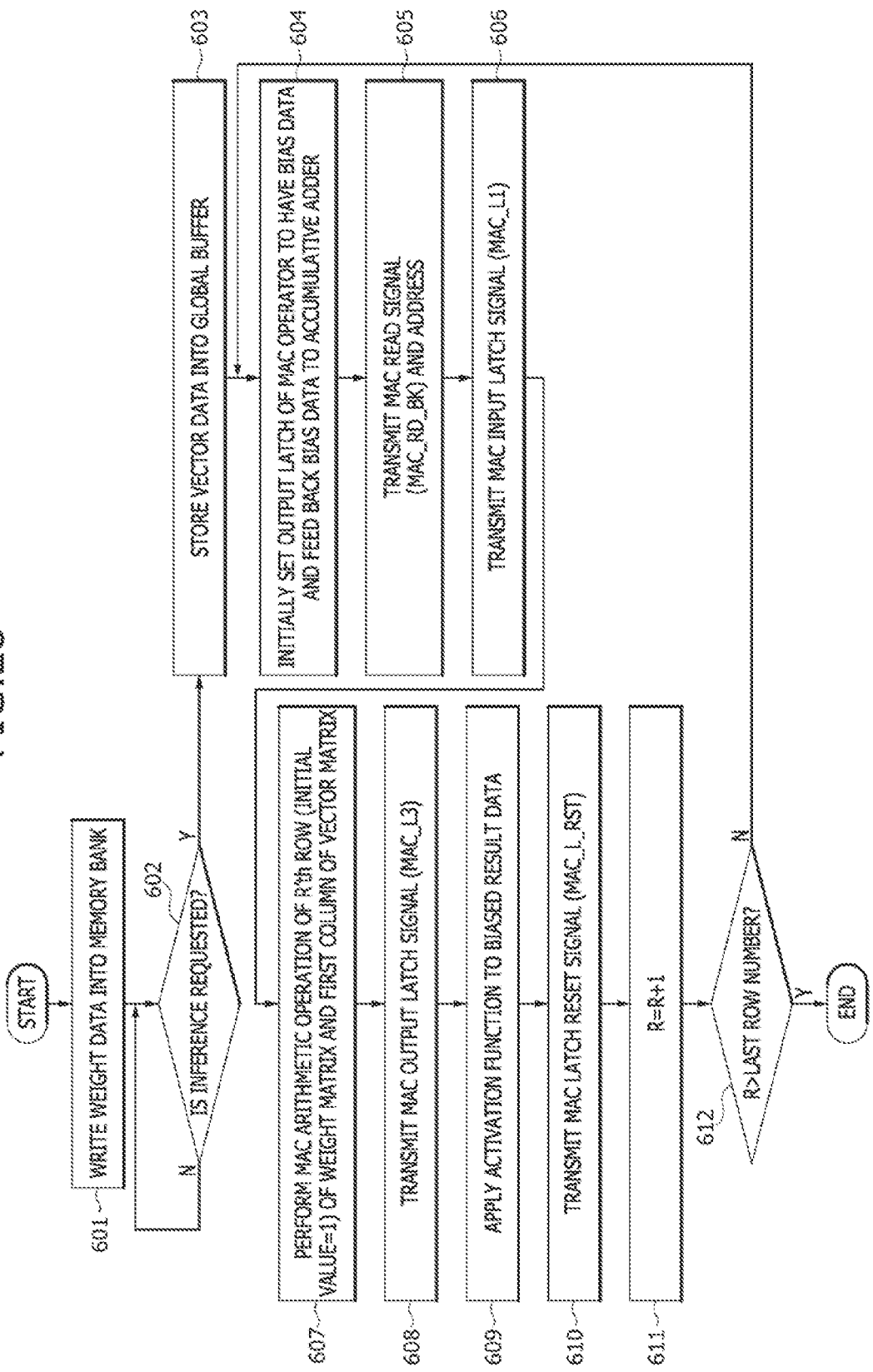
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the activation function logic circuit 123-5, which is illustrated in FIG. 19. At a step 610, the activation function logic circuit 123-5 may apply an activation function to the biased result data Y0.0 to generate a final output value, and the final output value may be inputted to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value outputted from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
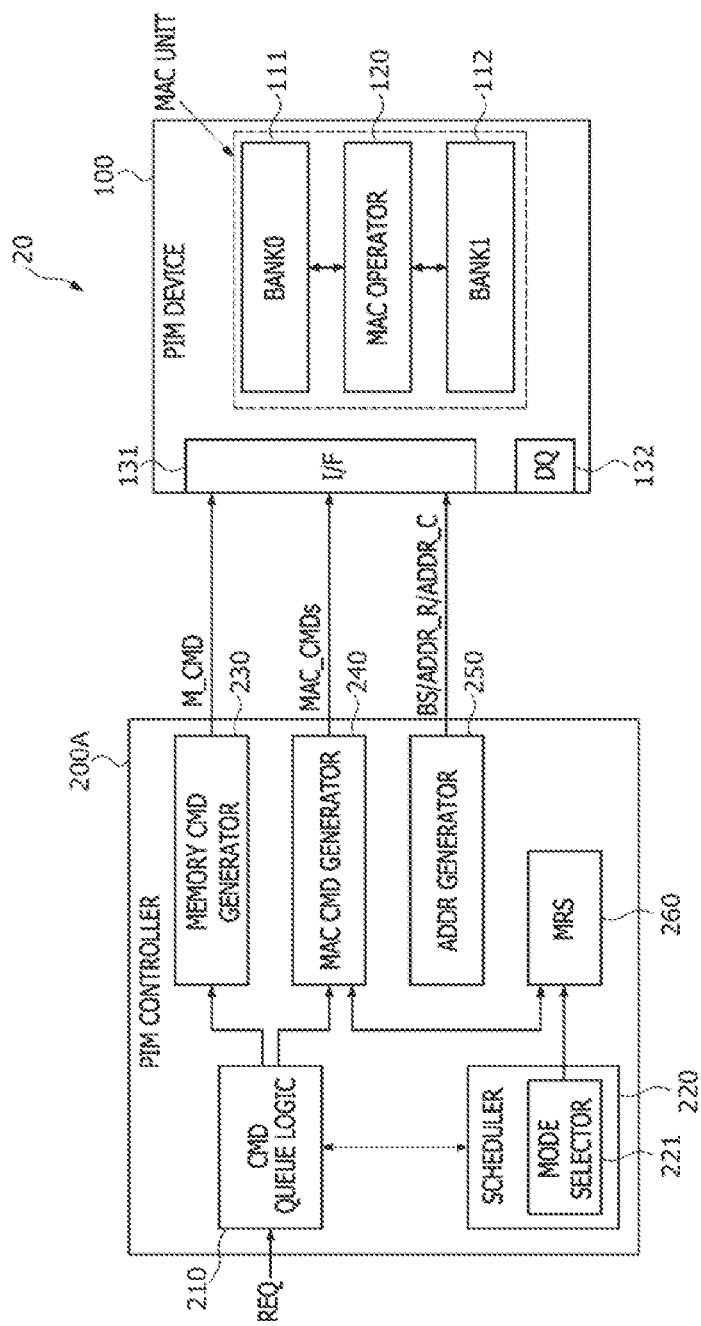
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
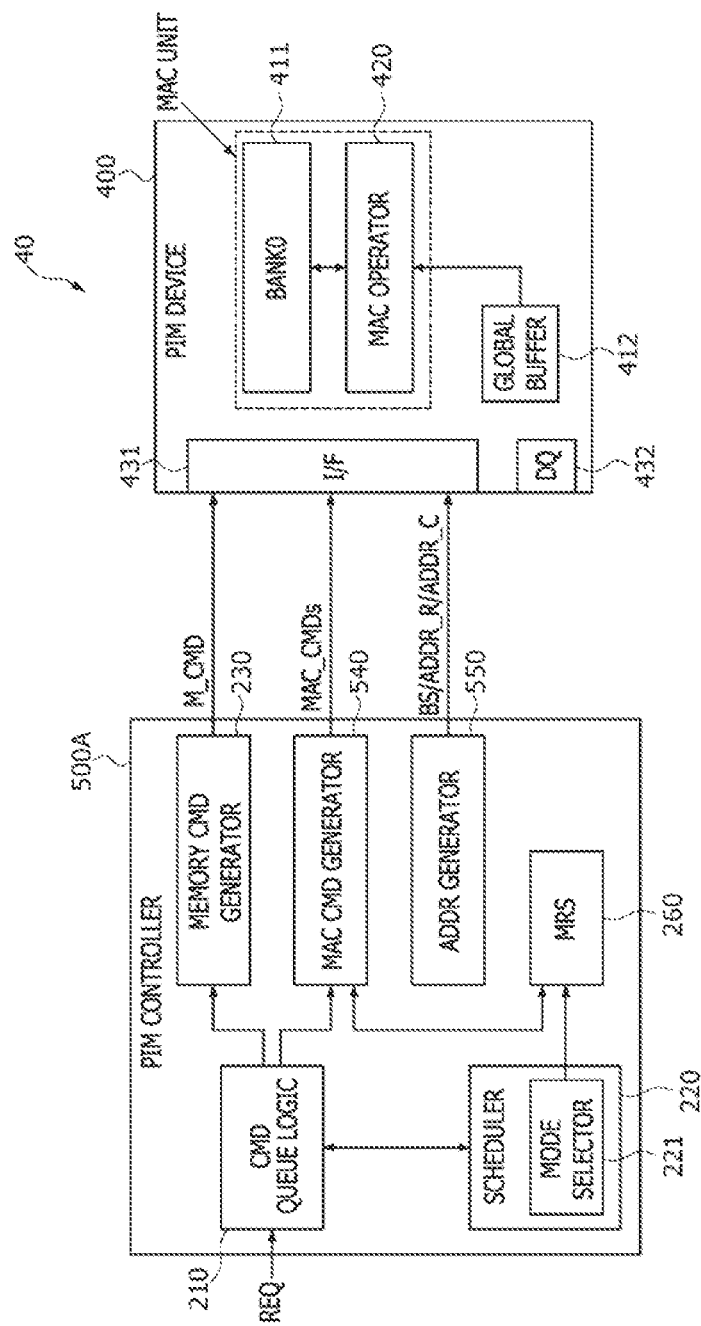
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
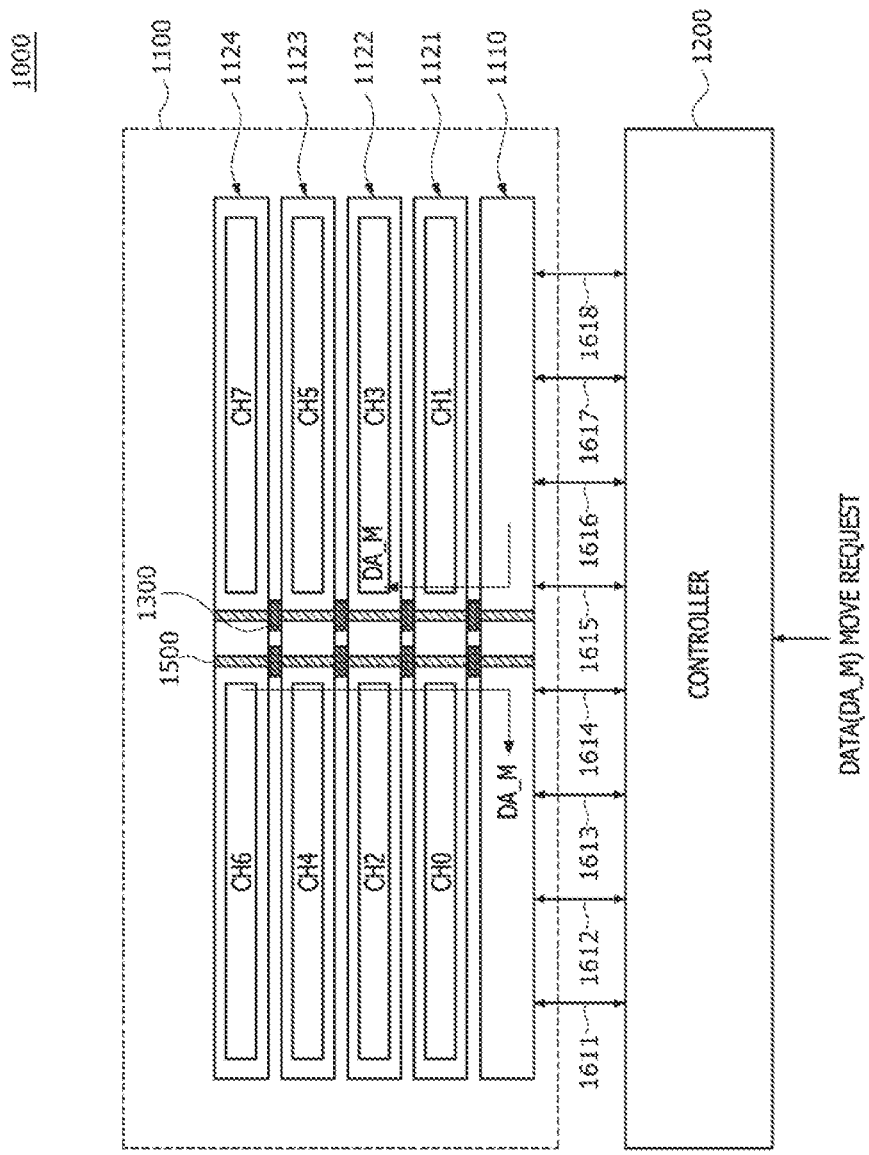
FIG. 31 illustrates a memory system according to an embodiment of the present disclosure.

FIG. 31 illustrates a memory system 1000 according to an embodiment of the present disclosure. Referring to FIG. 31, the memory system 1000 may include a stacked memory device 1100 and a controller 1200. The stacked memory device 1100 may include a base die 1110 and a plurality of memory dies (e.g., first to fourth memory dies 1121-1124). In an embodiment, the base die 1110 may be disposed to correspond to a lowermost die on which the first to fourth memory dies 1121-1124 are staked. The first to fourth memory dies 1121-1124 may be sequentially and vertically stacked on a surface of the base die 1110. Although only the first to fourth memory dies 1121-1124 are illustrated in the present embodiment, the present embodiment is merely an example of the present disclosure. Accordingly, the number of memory dies may be greater or less than four in some other embodiments.

The first memory die 1121 corresponding to a lowermost die among the first to fourth memory dies 1121-1124 may be disposed to be closer to the base die 1110 than any other memory dies. The first memory die 1121 may be electrically connected to the base die 1110 through interconnectors 1300. Each of the second to fourth memory dies 1122-1124 may also be electrically connected to the adjacent memory die through the interconnectors 1300. In an embodiment, the interconnectors 1300 may include bumps. The interconnectors 1300 may be a plurality of interconnectors. The base die 1110 corresponding to a lowermost die of the stacked memory device 1100 may transmit signals and/or data, which are provided by an external device (e.g., the controller 1200), to each of the first to fourth memory dies 1121-1124. The base die 1110 may transmit the data, which are outputted from each of the first to fourth memory dies 1121-1124, to the controller 1200.

A plurality of through electrodes 1500, for example, a plurality of through silicon vias (TSVs), may be disposed in each of the base die 1110 and the first to fourth memory dies 1121-1124. The through electrodes 1500 may be disposed to vertically penetrate each of the base die 1110 and the first to fourth memory dies 1121-1124. The through electrodes 1500 disposed in each of the base die 1110 and the first to fourth memory dies 1121-1124 may be a plurality of through electrodes. The through electrodes 1500 may be electrically connected to the interconnectors 1300. One (e.g., the fourth memory die 1124) of the first to fourth memory dies 1121-1124 may communicate with the base die 1110 via the through electrodes 1500 of the underlying memory dies (i.e., the first to third memory dies 1121-1123).

The first to fourth memory dies 1121-1124 may have a plurality of channels, for example, eight channels (i.e., first to eighth channels CH0-CH7). In the present embodiment, it may be assumed that each of the memory dies 1121-1124 have two channels. The first memory die 1121 may have the first channel CH0 and the second channel CH1, and the second memory die 1122 may have the third channel CH2 and the fourth channel CH3. In addition, the third memory die 1123 may have the fifth channel CH4 and the sixth channel CH5, and the fourth memory die 1124 may have the seventh channel CH6 and the eighth channel CH7. A configuration of the channels of each of the memory dies 1121-1124 will be described in more detail hereinafter. The base die 1110 may act as an independent interface for each of the channels CH0-CH7 of the memory dies 1121-1124. Although not shown in FIG. 31, internal signal/data transmission paths corresponding to respective ones of the channels CH0-CH7 and physical layers coupled to the internal signal/data transmission paths may be disposed in the base die 1110.

A plurality of external signal/data transmission paths (e.g., first to eighth external signal/data transmission paths 1611-1618) may be disposed between the base die 1110 and the controller 1200. The first to eighth external signal/data transmission paths 1611-1618 may correspond to the first to eighth channels CH0-CH7, respectively. For example, the first external signal/data transmission path 1611 may be disposed between the base die 1110 and the controller 1200 to act as a path of signal/data transmitted through the first channel CH0, and the second external signal/data transmission path 1612 may be disposed between the base die 1110 and the controller 1200 to act as a path of signal/data transmitted through the second channel CH1. Similarly, the eighth external signal/data transmission path 1618 may be disposed between the base die 1110 and the controller 1200 to act as a path of signal/data transmitted through the eighth channel CH7.

The controller 1200 may control various operations of the memory dies 1121-1124, for example, operations for accessing to respective ones of the memory dies 1121-1124. The control operations of the controller 1200 may be performed in response to requests outputted from an external device such as a host (or a host controller). The controller 1200 may transmit signals such as a command and an address corresponding to the request provided by the external device to the base die 1110 through the first to eighth external signal/data transmission paths 1611-1618. The base die 1110 may transmit the signals, which are outputted from the controller 1200, to the memory dies 1121-1124 through the first to eighth channels CH0-CH7.

The controller 1200 may perform a control operation for transmitting moving data DA_M from one channel (hereinafter, referred to as a 'target channel') included in one of the memory dies 1121-1124 to one channel (hereinafter, referred to as a 'destination channel') included in another one of the memory dies 1121-1124. This data move control operation of the controller 1200 may be performed in response to a data move request outputted from the host. Hereinafter, the control operation of the controller 1200 will be described in conjunction with a case for which the moving data DA_M are transmitted from the seventh channel CH6 to the fourth channel CH3. The data move control operation of the controller 1200 may be performed by sequentially executing a first data move control operation (also, referred to as a 'first data move operation') and a second data move control operation (also, referred to as a 'second data move operation'). The first data move control operation may be defined as a control operation of the controller 1200 for accessing to the fourth memory die 1124 and for storing the moving data DA_M in the fourth memory die 1124 into the base die 1110 through the seventh channel CH6. The second data move control operation may be defined as a control operation of the controller 1200 for storing the moving data DA_M stored in the base die 1110 into the second memory die 1122 through the fourth channel CH3.

According to the present embodiment, a process for transmitting the moving data DA_M, which are read out through the seventh channel CH6, to the controller 1200 is not required to transmit the moving data DA_M from the seventh channel CH6 to the fourth channel CH3. That is, in the event that the moving data DA_M are transmitted through a path including the seventh channel CH6, the base die 1110, and the fourth channel CH3, the data transmission speed may be relatively faster as compared with a case for which the moving data DA_M are read out of the fourth die 1124 through the seventh channel CH6 by a read operation of the controller 1200 and the moving data DA_M in the controller 1200 are written into the second memory die 1122 through the fourth channel CH3 by a write operation of the controller 1200. The data move operation according to the present embodiment may be equally applicable to a data copy operation for transmitting the data from the target channel to the destination channel.

Figure 32:
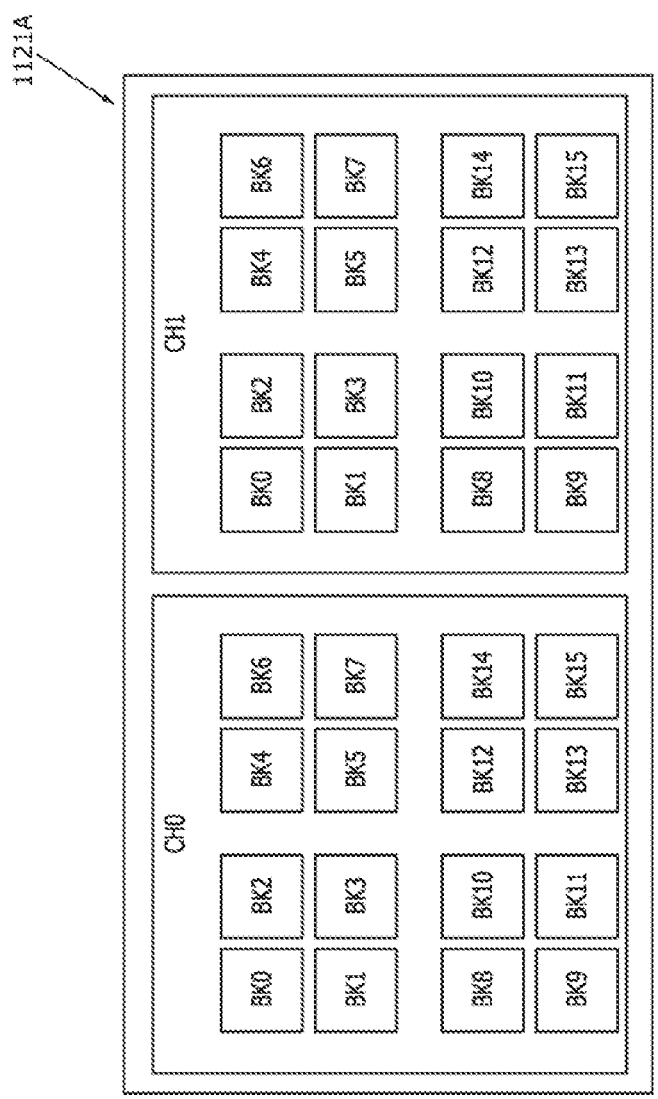
FIGS. 32 to 34 illustrate various examples of a memory die of memory dies constituting a stacked memory device included in the memory system illustrated in FIG. 31.
Figure 33:
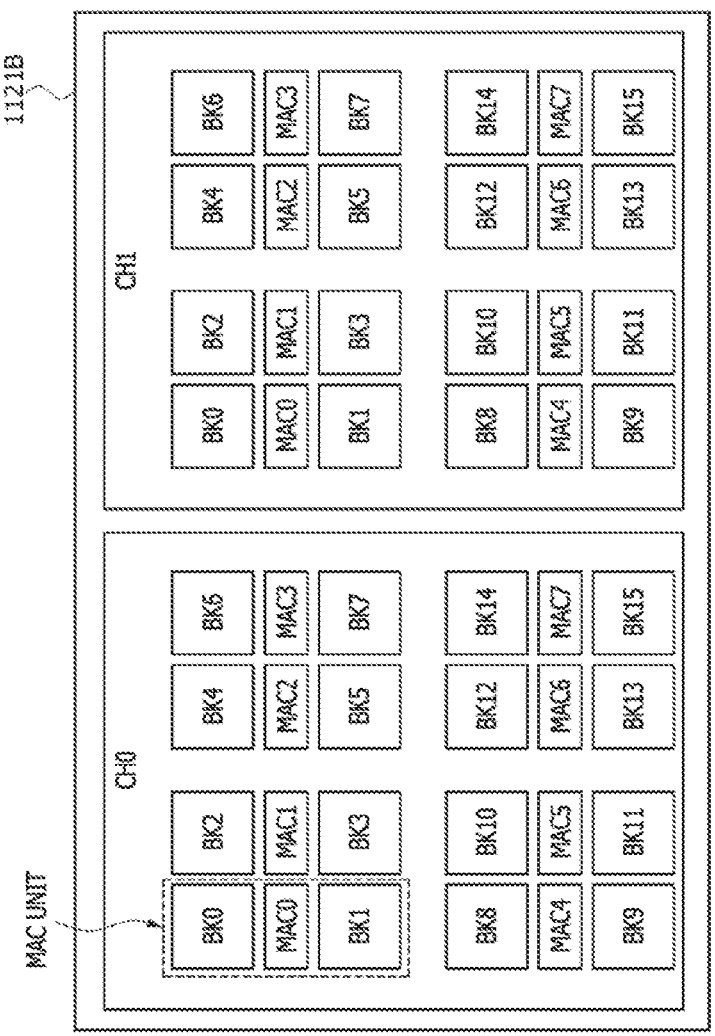
Figure 34:
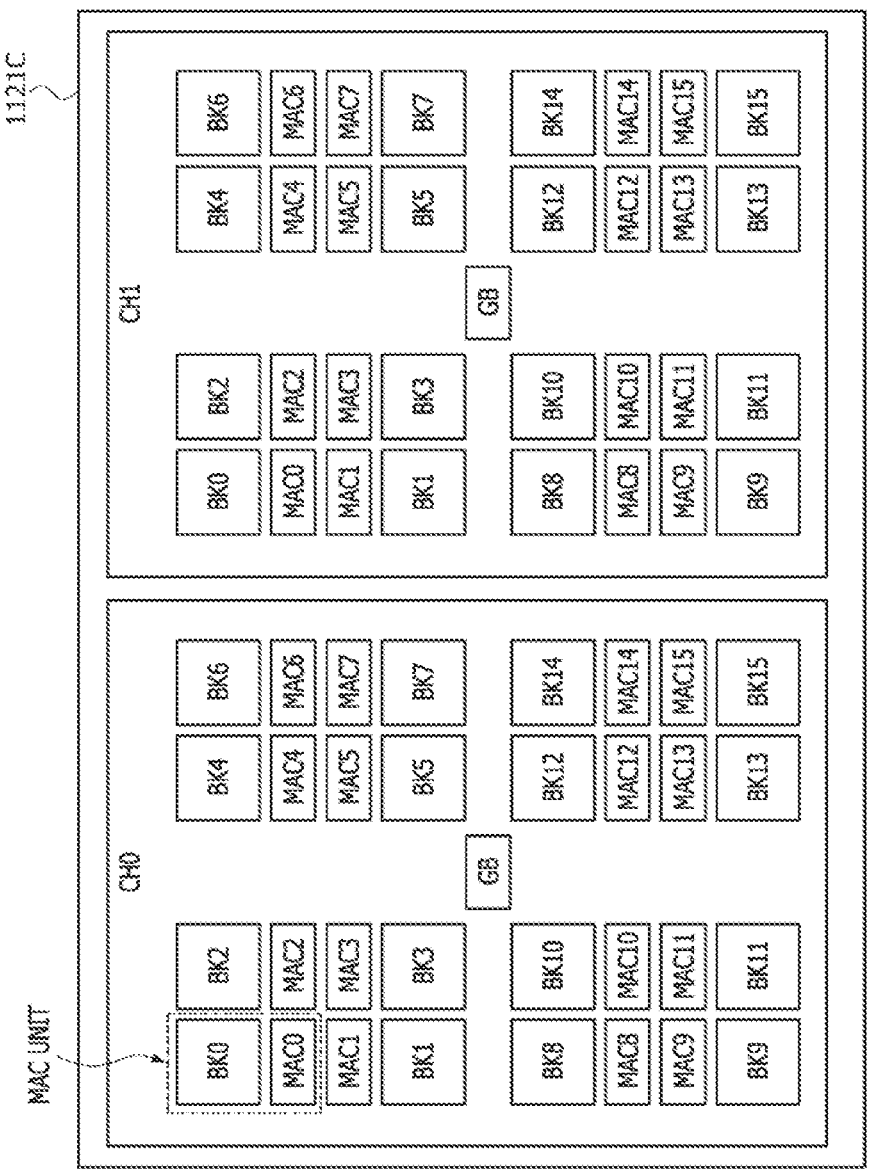

FIGS. 32 to 34 illustrate first memory dies 1121A, 1121B, and 1121C corresponding to various examples of one (e.g., the first memory die 1121) among the first to fourth memory dies 1121-1124 constituting the stacked memory device 1100 included in the memory system 1000 illustrated in FIG. 31. For the purpose of ease and convenience in explanation, the illustration of the through electrodes 1500 is omitted in FIGS. 32 to 34. In FIGS. 32 to 34, it may be assumed that each of the first memory dies 1121A, 1121B, and 1121C has the first channel CH0 and the second channel CH1 which are distinguished from each other. As illustrated in FIG. 32, the first channel CH0 of the first memory die 1121A may include a plurality of memory banks, for example, first to sixteenth memory banks BK0-BK15. The second channel CH1 of the first memory die 1121A may also include a plurality of memory banks, for example, first to sixteenth memory banks BK0-BK15. Each of the first to sixteenth memory banks BK0-BK15 included in the first channel CH0 or the second channel CH1 may include a plurality of memory cell arrays. In an embodiment, each of the first to sixteenth memory banks BK0-BK15 included in the first channel CH0 or the second channel CH1 may be accessed independently. In the present embodiment, the moving data DA_M may be data stored in the first to sixteenth memory banks BK0-BK15 included in each of the first and second channels CH0 and CH1.

Next, as illustrated in FIG. 33, the first channel CH0 of the first memory die 1121B may include a plurality of memory banks (e.g., first to sixteenth memory banks BK0-BK15 and a plurality of arithmetic circuits (e.g., first to eighth arithmetic circuits MAC0-MAC7 also referred to as 'first to eighth MAC circuits MAC0-MAC7'). The second channel CH1 of the first memory die 1121B may also have the same configuration as the first channel CH0 of the first memory die 1121B. One of the first to eighth arithmetic circuits MAC0-MAC7 may constitute one arithmetic unit (also, referred to as a 'MAC unit') with two memory banks adjacent to the one arithmetic unit. For example, the first MAC circuit MAC0 and the first and second memory banks BK0 and BK1 adjacent to the first MAC circuit MAC0 may constitute one MAC unit. In one MAC unit, the two memory banks may provide weight data and vector data respectively, and the MAC circuit may perform an arithmetic operation (i.e., a MAC operation) for the weight data and the vector data. The operation of the memory banks and the MAC circuit constituting the MAC unit may be the same as the operation described with reference to FIGS. 7 to 13. In the present embodiment, the moving data DA_M may be data stored in the first to sixteenth memory banks BK0-BK15 included in each of the first and second channels CH0 and CH1 or arithmetic result data generated by the MAC circuit.

Next, as illustrated in FIG. 34, the first channel CH0 of the first memory die 1121C may include a plurality of memory banks (e.g., first to sixteenth memory banks BK0-BK15 and a plurality of arithmetic circuits (e.g., first to sixteenth arithmetic circuits MAC0-MAC15 also referred to as 'first to sixteenth MAC circuits MAC0-MAC15'), and a global buffer GB. The second channel CH1 of the first memory die 1121C may also have the same configuration as the first channel CH0 of the first memory die 1121C. One of the first to sixteenth MAC circuits MAC0-MAC15 may constitute one arithmetic unit (also, referred to as a 'MAC unit') with one memory bank adjacent to the one arithmetic unit. For example, the first MAC circuit MAC0 and the first memory bank BK0 adjacent to the first MAC circuit MAC0 may constitute one MAC unit. In one MAC unit, the memory bank may output weight data to the MAC circuit. The global buffer GB may output vector data to all of the MAC circuits in the MAC units. In one MAC unit, the MAC circuit may perform the arithmetic operation (e.g., the MAC operation) for the weight data outputted from the memory bank and the vector data outputted from the global buffer GB. The operation of the memory banks and the MAC circuit constituting the MAC unit may be the same as the operation described with reference to FIGS. 23 to 26. In the present embodiment, the moving data DA_M may be data stored in the first to sixteenth memory banks BK0-BK15 included in each of the first and second channels CH0 and CH1 or arithmetic result data generated by the MAC circuit.

Figure 35:
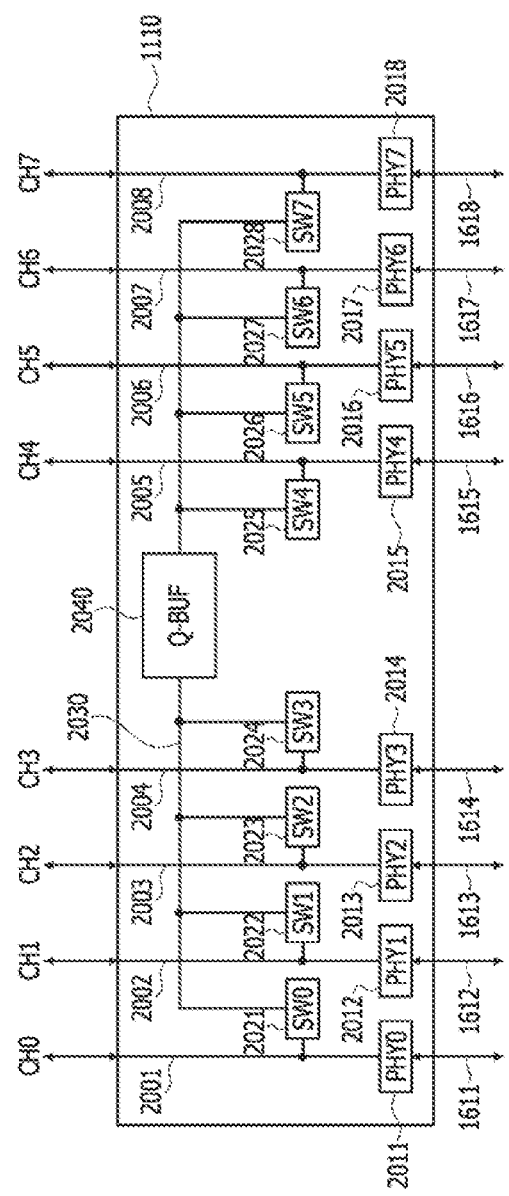
FIG. 35 illustrates a configuration of a base die included in the memory system illustrated in FIG. 31.

FIG. 35 illustrates a configuration of the base die 1110 included in the memory system 1000 illustrated in FIG. 31. Referring to FIG. 35, the base die 1110 may include first to eighth internal signal/data transmission paths 2001-2008, first to eighth physical layers (PHY0-PHY7) 2011-2018, first to eighth switches (SW0-SW7) 2021-2028, a global channel I/O line 2030, and buffer memory (Q-BUF) 2040. The first to eighth internal signal/data transmission paths 2001-2008 may be configured to communicate with the first to eighth channels CH0-CH7 of the memory dies 1121-1124, respectively. For example, the first internal signal/data transmission path 2001 may be configured to communicate with the first channel CH0 of the first memory die 1121, and the second internal signal/data transmission path 2002 may be configured to communicate with the second channel CH1 of the first memory die 1121. Similarly, the eighth internal signal/data transmission path 2008 may be configured to communicate with the eighth channel CH7 of the fourth memory die 1124.

The first to eighth physical layers 2011-2018 may be connected to the first to eighth internal signal/data transmission paths 2001-2008, respectively. For example, the first physical layer 2011 may be connected to the first internal signal/data transmission path 2001, and the second physical layer 2012 may be connected to the second internal signal/data transmission path 2002. Similarly, the eighth physical layer 2018 may be connected to the eighth internal signal/data transmission path 2008. The first to eighth physical layers 2011-2018 may be connected to first to eighth external signal/data transmission paths 1611-1618, which are disposed in an outside region of base die 1110, respectively. For example, the first physical layer 2011 may be connected to the first external signal/data transmission path 1611. Thus, the first physical layer 2011 may act as an interface for transmission of signal/data between the first internal signal/data transmission path 2001 and the first external signal/data transmission path 1611. In addition, the second physical layer 2012 may be connected to the second external signal/data transmission path 1612. Thus, the second physical layer 2012 may act as an interface for transmission of signal/data between the second internal signal/data transmission path 2002 and the second external signal/data transmission path 1612. Similarly, the eighth physical layer 2018 may be connected to the eighth external signal/data transmission path 1618. Thus, the eighth physical layer 2018 may act as an interface for transmission of signal/data between the eighth internal signal/data transmission path 2008 and the eighth external signal/data transmission path 1618.

First terminals of the first to eighth switches 2021-2028 may be connected to the first to eighth internal signal/data transmission paths 2001-2008, respectively. For example, the first terminal of the first switch 2021 may be connected to the first internal signal/data transmission path 2001, and the first terminal of the second switch 2022 may be connected to the second internal signal/data transmission path 2002. Similarly, the first terminal of the eighth switch 2028 may be connected to the eighth internal signal/data transmission path 2008. Second terminals of the first to eighth switches 2021-2028 may be connected to the global channel I/O line 2030. Thus, the first switch 2021 may perform a switching operation between the first internal signal/data transmission path 2001 and the global channel I/O line 2030, and the second switch 2022 may perform a switching operation between the second internal signal/data transmission path 2002 and the global channel I/O line 2030. Similarly, the eighth switch 2028 may perform a switching operation between the eighth internal signal/data transmission path 2008 and the global channel I/O line 2030. The first to eighth internal signal/data transmission paths 2001-2008 may be electrically connected to or disconnected from the global channel I/O line 2030 by switching operations of the first to eighth switches 2021-2028. The switching operations of the first to eighth switches 2021-2028 may be independently performed by a switching control signal outputted from the controller (1200 of FIG. 1). Descriptions relating to the switching control signal for the switching operations of the first to eighth switches 2021-2028 will be omitted hereinafter.

The global channel I/O line 2030 may be connected to the second terminals of the first to eighth switches 2021-2028 and may also be connected to the buffer memory 2040. Thus, the global channel I/O line 2030 may be used as a data transmission path between the buffer memory 2040 and each of the first to eighth internal signal/data transmission paths 2001-2008 through the first to eighth switches 2021-2028. In an embodiment, when the first switch 2021 is switched on and the remaining switches (i.e., the second to eighth switches 2022-2028) are switched off, data loaded on the first internal signal/data transmission path 2001 may be transmitted to the buffer memory 2040 through the global channel I/O line 2030, or data stored in the buffer memory 2040 may be transmitted to the first internal signal/data transmission path 2001 through the global channel I/O line 2030.

The buffer memory 2040 may store the data transmitted through the global channel I/O line 2030. In addition, the buffer memory 2040 may output the stored data to the global channel I/O line 2030. In an embodiment, the buffer memory 2040 may be realized using static random access memory (SRAM). However, the SRAM is merely an example of a suitable memory for the buffer memory 2040. Accordingly, in some other embodiments, the buffer memory 2040 may be realized using any memory which is capable of receiving, storing, and outputting data. The buffer memory 2040 may receive the moving data DA_M from a target channel to temporarily store the moving data DA_M during the data move operation for transmitting the moving data DA_M from the target channel to the destination channel. The moving data DA_M temporarily stored in the buffer memory 2040 may be re-transmitted to the destination channel. During the data move operation, the access to the buffer memory 2040 may be executed by the controller (1200 of FIG. 1).

Figure 36:
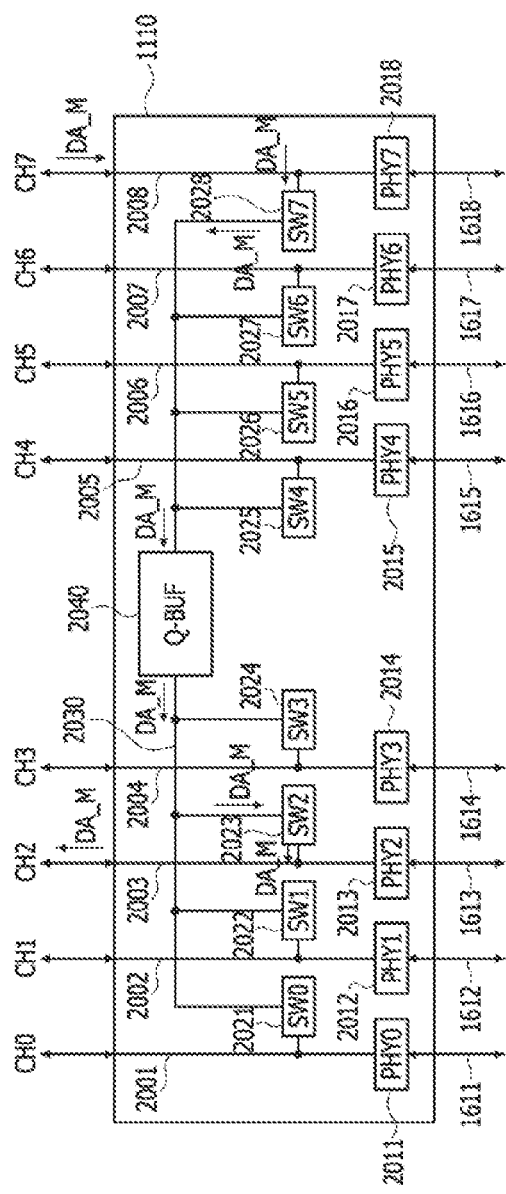
FIG. 36 illustrates a transmission path for moving data in a base die during a data move operation of the memory system illustrated in FIG. 31.

FIG. 36 illustrates a transmission path of the moving data DA_M in the base die 1110 during the data move operation of the memory system 1000 illustrated in FIG. 31. In the present embodiment, it may be assumed that the target channel is the eighth channel CH7 and the destination channel is the third channel CH2. In FIG. 36, the same reference numerals or symbols as used in FIG. 35 denote the same elements. Referring to FIG. 36, in order to transmit the moving data DA_M stored in the eighth channel CH7 corresponding to the target channel to the third channel CH2 corresponding to the destination channel, the first data move operation and the second data move operation may be sequentially performed. First, the moving data DA_M may be transmitted from the eighth channel CH7 to the eighth internal signal/data transmission path 2008 by the first data move operation. Only the eighth switch 2028, which is connected to the eighth channel CH7 corresponding to the target channel, among the first to eighth switches 2021-2028 disposed in the base die 1110 may be switched on and the remaining switches (i.e., the first to seventh switches 2021-2027) may be switched off. Thus, the moving data DA_M loaded on the eighth internal signal/data transmission path 2008 are not transmitted to the controller (1200 of FIG. 31) but transmitted to the global channel I/O line 2030 through the eighth switch 2028. The moving data DA_M transmitted to the global channel I/O line 2030 may be stored into the buffer memory 2040.

Next, while the second data move operation is performed, only the third switch 2023, which is connected to the third channel CH2 corresponding to the destination channel, among the first to eighth switches 2021-2028 disposed in the base die 1110 may be switched on and the remaining switches (i.e., the first and second switches 2021 and 2022 and the fourth to eighth switches 2024-2028) may be switched off. The moving data DA_M stored in the buffer memory 2040 may be outputted. The moving data DA_M outputted from the buffer memory 2040 may be transmitted to the third internal signal/data transmission path 2003 through the global channel I/O line 2030 and the third switch 2023. The moving data DA_M loaded on the third internal signal/data transmission path 2003 are not transmitted to the controller (1200 of FIG. 31) but transmitted to and stored into the third channel CH2.

Figure 37:
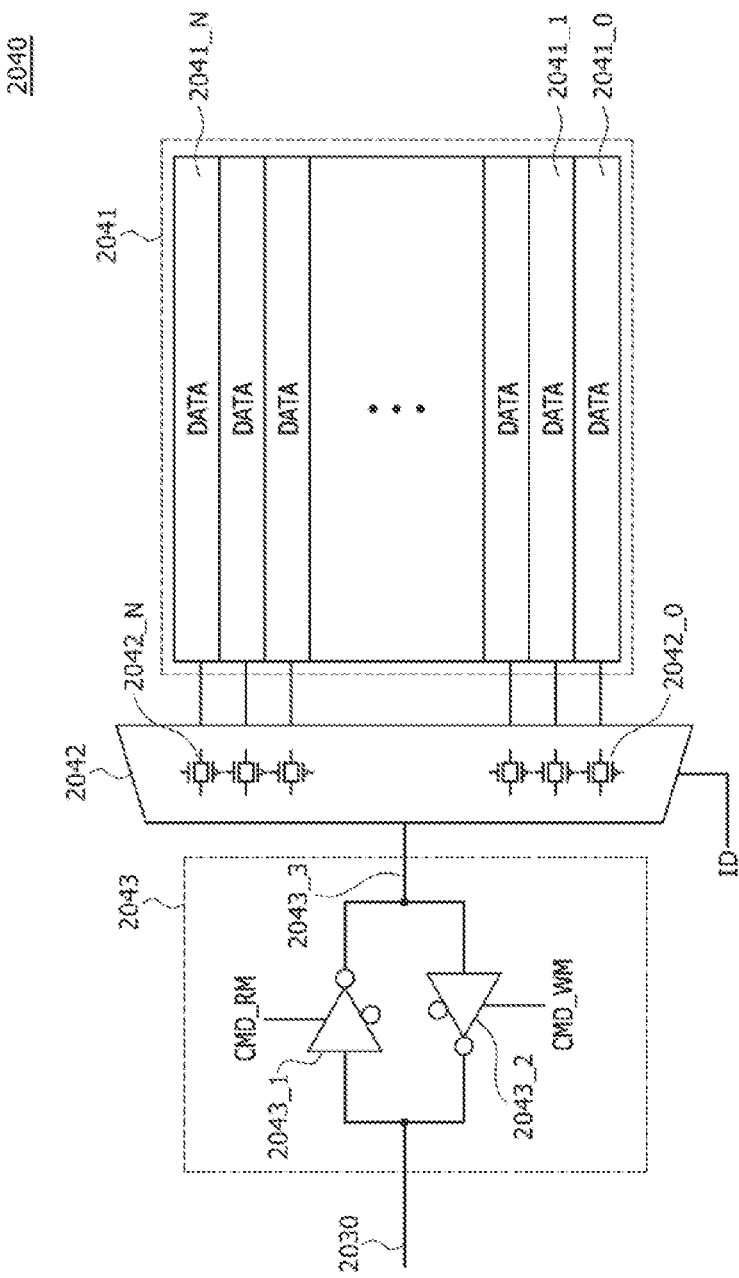
FIG. 37 illustrates a configuration of buffer memory included in the base die illustrated in FIG. 36.

FIG. 37 illustrates a configuration of the buffer memory 2040 included in the base die 1110 illustrated in FIG. 36. Referring to FIG. 37, the buffer memory 2040 may include a data storage part 2041, an identification (ID) part 2042, and an I/O part 2043. The data storage part 2041 may include a plurality of data storage regions (e.g., first to $(N+1)^{th}$ data storage regions 2041_0-2041_N) (where, "N" is zero or a positive integer greater than zero). Each of the first to $(N+1)^{th}$ data storage regions 2041_0-2041_N may store the data transmitted through the I/O part 2043 and the ID part 2042. The ID part 2042 may identify each of the first to $(N+1)^{th}$ data storage regions 2041_0-2041_N. In an embodiment, the ID part 2042 may include a plurality of transfer gates, for example, first to $(N+1)^{th}$ transfer gates 2042_0-2042_N.

The first to $(N+1)^{th}$ transfer gates 2042_0-2042_N may be connected to the first to $(N+1)^{th}$ data storage regions 2041_0-2041_N, respectively, in a one-to-one relationship, and all of the first to $(N+1)^{th}$ transfer gates 2042_0-2042_N may be connected to the I/O part 2043. For example, the first transfer gate 2042_0 may be connected to the first data storage region 2041_0, and the $(N+1)^{th}$ transfer gate 2042_N may be connected to the $(N+1)^{th}$ data storage region 2041_N. Each of the first to $(N+1)^{t}$ transfer gates 2042_0-2042_N may control data transmission between each of the first to $(N+1)^{th}$ data storage regions 2041_0-2041_N and the I/O part 2043 based on an identification signal ID outputted from the controller (1200 of FIG. 31). For example, when the first transfer gate 2042_0 is designated by the identification signal ID, data transmission between the first data storage region 2041_0 and the I/O part 2043 may be executed and no data transmission is executed between the I/O part 2043 and the remaining data storage regions (i.e., the second to $(N+1)^{th}$ data storage regions 2041_1-2041_N).

The I/O part 2043 may control a data transmission direction between the global channel I/O line 2030 and the ID part 2042. In an embodiment, the I/O part 2043 may include a first tri-state inverter 2043-1 and a second tri-state inverter 2043-2 which are coupled between an I/O line 2043-3 connected to the ID part 2042 and the global channel I/O line 2030. An input terminal and an output terminal of the first tri-state inverter 2043-1 may be connected to the global channel I/O line 2030 and the I/O line 2043-3, respectively. An input terminal and an output terminal of the second tri-state inverter 2043-2 may be connected to the I/O line 2043-3 and the global channel I/O line 2030, respectively. A move read command CMD_RM may be inputted to a control signal input terminal of the first tri-state inverter 2043-1. A move write command CMD_WM may be inputted to a control signal input terminal of the second tri-state inverter 2043-2. The move read command CMD_RM and the move write command CMD_WM may be outputted from the controller (1200 of FIG. 31). In an embodiment, the move read command CMD_RM and the move write command CMD_WM may be sequentially inputted to the I/O part 2043.

When the move read command CMD_RM is transmitted to the I/O part 2043, the first tri-state inverter 2043-1 may be enabled and data loaded on the global channel I/O line 2030 may be stored into one of the first to $(N+1)^{th}$ data storage regions 2041_0-2041_N, which is selected by the identification signal ID, through the first tri-state inverter 2043-1, the I/O line 2043-3, and the ID part 2042. While the data loaded on the global channel I/O line 2030 is stored into one of the first to $(N+1)^{th}$ data storage regions 2041_0-2041_N data, the output terminal of the second tri-state inverter 2043-2 may maintain a high impedance state. When the move write command CMD_WM is transmitted to the I/O part 2043, the second tri-state inverter 2043-2 may be enabled. In such a case, data stored in one of the first to $(N+1)^{th}$ data storage regions 2041_0-2041_N, which is selected by the identification signal ID, may be inputted to the second tri-state inverter 2043-2 through the ID part 2042 and the I/O line 2043-3. The data inputted to the second tri-state inverter 2043-2 may be transmitted to the global channel I/O line 2030 through the second tri-state inverter 2043-2. While the data stored in one of the first to $(N+1)^{th}$ data storage regions 2041_0-2041_N are transmitted to the global channel I/O line 2030, the output terminal of the first tri-state inverter 2043-2 may maintain a high impedance state.

Figure 38:
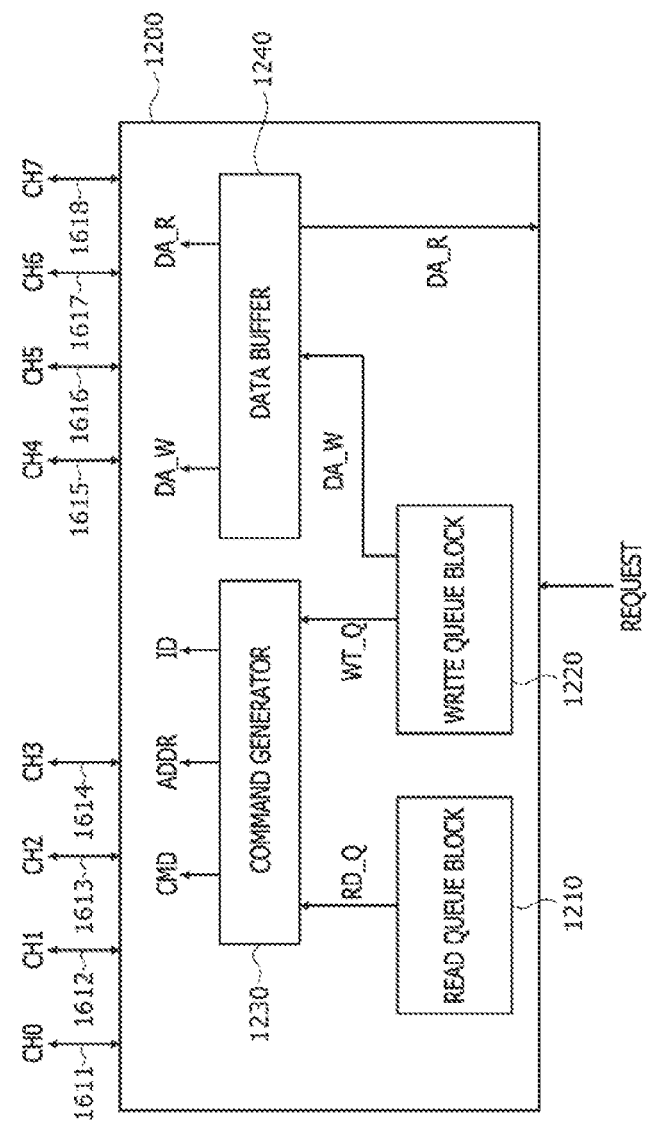
FIG. 38 illustrates a configuration of a controller included in the memory system illustrated in FIG. 31.
Figure 39:
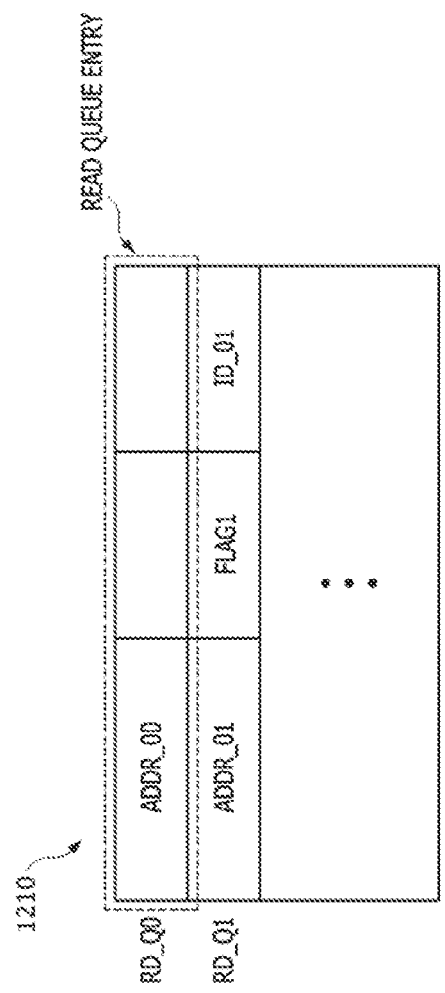
FIG. 39 illustrates a read queue block included in the controller illustrated in FIG. 38.
Figure 40:
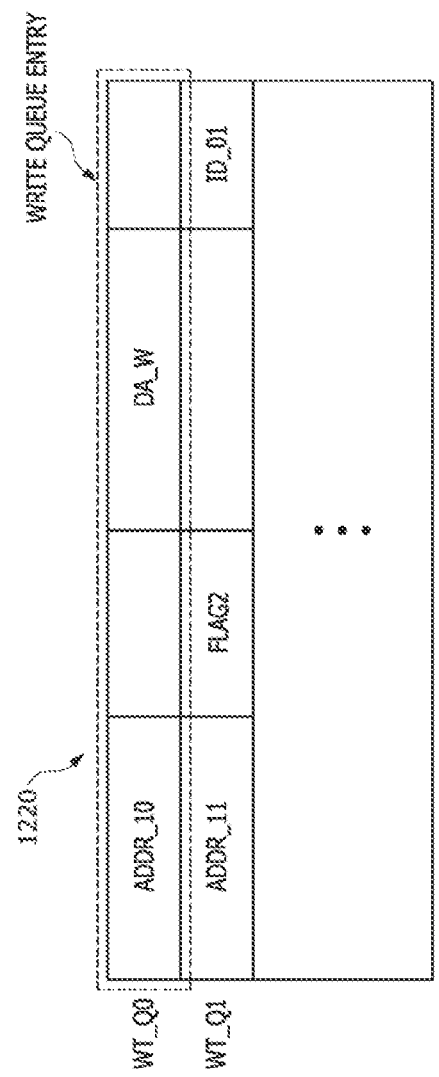
FIG. 40 illustrates a write queue block included in the controller illustrated in FIG. 38.

FIG. 38 illustrates a configuration of the controller 1200 included in the memory system 1000 illustrated in FIG. 31. In addition, FIGS. 39 and 40 illustrate a read queue block 1210 and a write queue block 1220, respectively, included in the controller 1200 illustrated in FIG. 38. First, referring to FIG. 38, the controller 1200 may include the read queue block 1210, the write queue block 1220, a command generator 1230, and a data buffer 1240. A request outputted from a host may be inputted to the read queue block 1210 or the write queue block 1220. The read queue block 1210 may store a read request or a move read request which is outputted from the host. The write queue block 1220 may store a write request or a move write request which is outputted from the host.

As illustrated in FIG. 39, the read queue block 1210 may include a plurality of read queue entries. Each of the plurality of read queue entries may include an address ADDR, a first flag signal FLAG1, and the identification signal ID. In FIG. 39, a first read queue RD_Q0 may correspond to a data read request for one of the channels CH0-CH7 included in the memory dies (1121-1124 of FIG. 31). In contrast, a second read queue RD_Q1 may correspond to a move read request for transmitting the move data from the target channel of the channels CH0-CH7 to the destination channel of the channels CH0-CH7. The read queue entry for the first read queue RD_Q0 corresponding to the data read request may include only an address ADDR_00 of a region in which read data are stored. In contrast, the read queue entry for the second read queue RD_Q1 corresponding to the move read request may include an address ADDR_01 of the moving data stored in the target channel, the first flag signal FLAG1, and the identification signal ID_01 inputted to the buffer memory (2040 of FIG. 35) of the base die 1110.

As illustrated in FIG. 40, the write queue block 1220 may include a plurality of write queue entries. Each of the plurality of write queue entries may include an address ADDR, a second flag signal FLAG2, the identification signal ID, and write data DA_W. In FIG. 40, a first write queue WT_Q0 may correspond to a data write request for one of the channels CH0-CH7 included in the memory dies (1121-1124 of FIG. 31). In contrast, a second write queue WT_Q1 may correspond to a move write request for transmitting the move data from the target channel of the channels CH0-CH7 to the destination channel of the channels CH0-CH7. The write queue entry for the first read queue WT_Q0 corresponding to the data write request may include write data DA_W and an address ADDR_10 of a region in which the write data DA_W have to be stored. In contrast, the write queue entry for the second write queue WT_Q1 corresponding to the move write request may include an address ADDR_11 of a region in which the moving data have to be stored in the target channel, the second flag signal FLAG2, and the identification signal ID_01 inputted to the buffer memory (2040 of FIG. 35) of the base die 1110.

The first flag signal FLAG1 of the read queue block 1210 and the second flag signal FLAG2 of the write queue block 1220 may be set to have a value of '1' after the moving data in the target channel are stored into the buffer memory (2040 of FIG. 36) by the move read request. An operation performed by the second write queue WT_Q1 of the write queue block 1220 may be performed after the second flag signal FLAG2 is set to have a value of '1'. The identification signal ID_01 of the read queue block 1210 may designate a data storage region of the buffer memory (2040 of FIG. 36) in which the moving data of the target channel are to be stored. The identification signal ID_01 of the write queue block 1220 may designate a data storage region of the buffer memory (2040 of FIG. 36) in which the moving data to be transmitted to the destination channel are stored. In the present embodiment, the data transmission from the target channel to the destination channel may be executed by a move read operation performed based on the second read queue RD_Q1 corresponding to the move read request and a move write operation performed based on the second write queue WT_Q1 corresponding to the move write request. Thus, the identification signal ID_01 in the read queue entry for the second read queue RD_Q1 of the read queue block 1210 may be identical to the identification signal ID_01 in the write queue entry for the second write queue WT_Q1 of the write queue block 1220.

Referring again to FIG. 38, the command generator 1230 in the controller 1200 may receive a read queue RD_Q from the read queue block 1210 or may receive a write queue WT_Q from the write queue block 1220. The command generator 1230 may output a command CMD corresponding to the read queue RD_Q or the write queue WT_Q, an address ADDR, and the identification signal ID. The command CMD outputted from the command generator 1230 may include a read command (CMD_R of FIG. 41), the move read command CMD_RM, a write command (CMD_W of FIG. 41), and the move write command CMD_WM. The command CMD and the address ADDR outputted from the command generator 1230 may be transmitted to one of the channels CH0-CH7 included in the memory dies 1121-1124 through the base die 1110. The move read command CMD_RM and the move write command CMD_WM included in the command CMD outputted from the command generator 1230 may be transmitted to the buffer memory (2040 of FIG. 36) in the base die 1110. Various control signals generated by the command generator 1230 in response to the read queue RD_Q and the write queue WT_Q will be described in more detail with reference to FIG. 41.

The data buffer 1240 may temporarily store the read data DA_R and the write data DA_W during the data read operation and the data write operation. During the data read operation, the data buffer 1240 may temporarily store the read data DA_R outputted from one selected among the channels CH0-CH7. The read data DA_R temporarily stored in the data buffer 1240 may be transmitted to an external device (e.g., a host) coupled to the controller 1200. During the data write operation, the data buffer 1240 may receive the write data DA_W from the write queue block 1220 and may temporarily store the write data DA_W. The write data DA_W temporarily stored in the data buffer 1240 may be transmitted to and stored into one of the channels CH0-CH7. Unlike the data read operation and the data write operation, the moving data are not transmitted to the controller 1200 during the data move operation for transmitting the moving data from the target channel to the destination channel. Thus, the data buffer 1240 does not store any data during the data move operation.

FIG. 41 is a table illustrating various control signals outputted from the command generator 1230 included in the controller 1200 according to queues generated in the controller 1200 and illustrating a data storage operation of the data buffer 1240 included in the controller 1200. Referring to FIGS. 38 to 41, in case of the first read queue RD_Q0 corresponding to the data read request, the command generator 1230 may generate the read command CMD_R and the address ADDR_00. The read command CMD_R and the address ADDR_00 may be transmitted to one of the channels CH0-CH7 in which the read data DA_R are stored, through the base die 1110. The data buffer 1240 may store the read data DA_R outputted from the channel designated by the address ADDR_00. In case of the first write queue WT_Q0 corresponding to the data write request, the command generator 1230 may generate the write command CMD_W and the address ADDR_10. The write command CMD_W and the address ADDR_10 may be transmitted to one of the channels CH0-CH7 through the base die 1110. The data buffer 1240 may store the write data DA_W to be transmitted to one of the channels CH0-CH7, which is designated by the address ADDR_10.

In case of the second read queue RD_Q1 corresponding to the move read request, the command generator 1230 may generate the move read command CMD_RM, the address ADDR_01, and the identification signal ID_01. The move read command CMD_RM may be transmitted to the target channel and the first tri-state inverter (2043_1 of FIG. 37) of the buffer memory (2040 of FIG. 37) included in the base die 1110. The address ADDR_01 may be transmitted to the target channel. The identification signal ID_01 may be transmitted to the ID part 2042 of the buffer memory (2040 of FIG. 37). While the move read operation is performed by the move read request, no data are stored into the data buffer 1240. In case of the second write queue WT_Q1 corresponding to the move write request, the command generator 1230 may generate the move write command CMD_WM, the address ADDR_11, and the identification signal ID_01. The move write command CMD_WM may be transmitted to the destination channel and the second tri-state inverter (2043_2 of FIG. 37) of the buffer memory (2040 of FIG. 37) included in the base die 1110. The address ADDR_11 may be transmitted to the destination channel. The identification signal ID_01 may be transmitted to the ID part 2042 of the buffer memory (2040 of FIG. 37). While the move write operation is performed by the move write request, no data are stored into the data buffer 1240.

Figure 42:
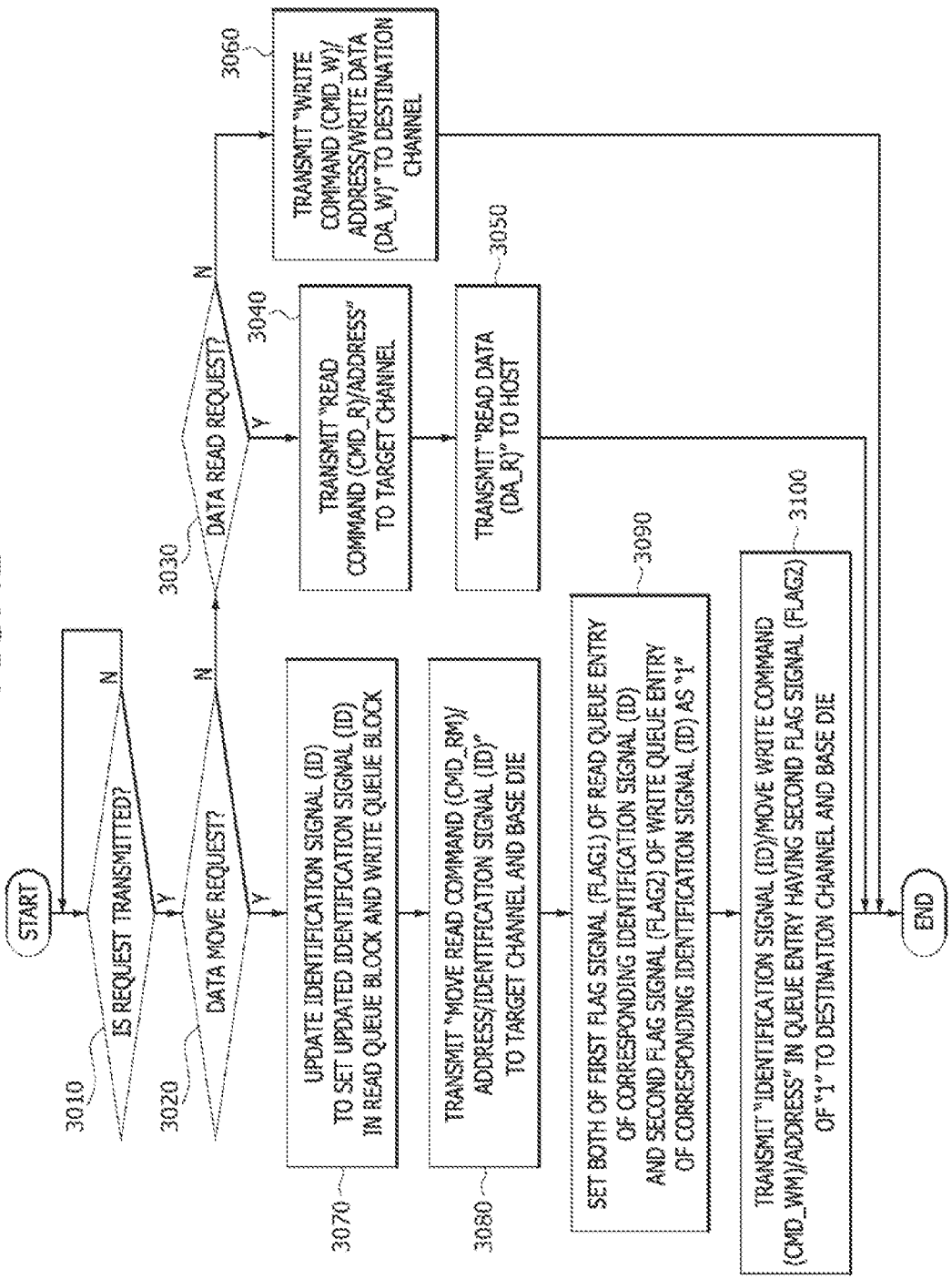
FIG. 42 is a flowchart illustrating a control operation of a controller included in the memory system illustrated in FIG. 31.

FIG. 42 is a flowchart illustrating a control operation of the controller 1200 included in the memory system 1000 illustrated in FIG. 31. Referring to FIG. 42, the controller 1200 may determine whether the request is transmitted from the host to the controller 1200 (see step 3010). When the request is not transmitted from the host to the controller 1200, the controller 1200 may maintain a standby state. When the request is transmitted from the host to the controller 1200, the controller 1200 may determine whether the request is the data move request (see step 3020). When the request is not the data move request at the step 3020, the controller 1200 may determine whether the request is the data read request (see step 3030).

When the request is the data read request at the step 3030, the command generator (1230 of FIG. 38) of the controller 1200 may generate the read command CMD_R and an address (see step 3040). The controller 1200 may transmit the read command CMD_R and the address to the target channel in which the read data DA_R are stored, through the base die (1110 of FIG. 31). The channel storing the read data DA_R among the channels CH0-CH7 may output the read data DA_R to the data buffer (1240 of FIG. 38) of the controller 1200 through the base die 1110. At a step 3050, the controller 1200 may transmit the read data DA_R, which is inputted to the data buffer 1240, to the host.

When the request is the data write request, and therefore not the data read request at the step 3030, the command generator (1230 of FIG. 38) of the controller 1200 may generate the write command CMD_W and an address (see step 3060). The controller 1200 may transmit the write command CMD_W and the address to the destination channel among the channels CH0-CH7 in which the write data DA_W have to be stored, through the base die (1110 of FIG. 31). In addition, the controller 1200 may also transmit the write data DA_W temporarily stored in the data buffer 1240 to the destination channel. The destination channel may store the write data DA_W into a region designated by the address in response to the write command CMD_W.

When the request is the data move request at the step 3020, the controller 1200 may update the identification signal ID (see step 3070). In an embodiment, the update of the identification signal ID may be executed by a count operation for increasing a value of the identification signal ID generated most recently. The identification signal ID updated at the step 3070 may be set in the read queue block 1210 and the write queue block 1220 included in the controller 1200. At a step 3080, the move read command CMD_RM, an address, and the identification signal ID may be transmitted to the base die 1110 and the target channel in which the moving data are stored. Specifically, the move read command CMD_RM may be transmitted to the target channel and the buffer memory (2040 of FIG. 37) of the base die 1110, and the address may be transmitted to the target channel. In addition, the identification signal ID may be transmitted to the buffer memory (2040 of FIG. 37).

The target channel may transmit the moving data, which are stored in a region designated by the address, to the base die 1110 in response to the move read command CMD_RM. As described with reference to FIG. 36, the moving data outputted from the target channel may be stored into the buffer memory (2040 of FIG. 37) of the base die 1110. An operation for storing the moving data into the buffer memory 2040 may be the same as described with reference to FIG. 37. At a step 3090, the controller 1200 may set both of the first flag signal FLAG1 in the read queue entry including the corresponding identification signal ID among the read queue entries of the read queue block (1210 of FIG. 38) and the second flag signal FLAG2 in the write queue entry including the corresponding identification signal ID among the write queue entries of the write queue block (1220 of FIG. 38) to have a binary number of "1". Setting both of the first and second flag signals FLAG1 and FLAG2 as a binary number of "1" may be executed after the moving data are stored into the buffer memory 2040 of the base die 1110. In an embodiment, the step 3090 may be executed when a predetermined time (i.e., a time it takes the moving data in the target channel to be stored into the buffer memory 2040) elapses from a point in time when the step 3080 is executed. In another embodiment, the step 3090 may be executed after the controller 1200 determines whether the step 3080 is executed.

At a step 3100, the controller 1200 may transmit the identification signal ID, the move write command CMD_WM, and the address in a queue entry of the second flag signal FLAG2 set to have a binary number of "1" to the destination channel and the base die 1110. Specifically, the move write command CMD_WM may be transmitted to the destination channel and the buffer memory 2040 of the base die 1110, and the address may be transmitted to the destination channel. In addition, the identification signal ID may be transmitted to the buffer memory 2040. As described with reference to FIG. 36, the moving data stored in the buffer memory 2040 of the base die 1110 may be outputted from the base die 1110 and may be transmitted to the destination channel. An operation for transmitting the moving data from the buffer memory 2040 to the destination channel may be the same as described with reference to FIG. 37. The destination channel may store the moving data into a region designated by the address in response to the move write command CMD_WM.

Figure 43:
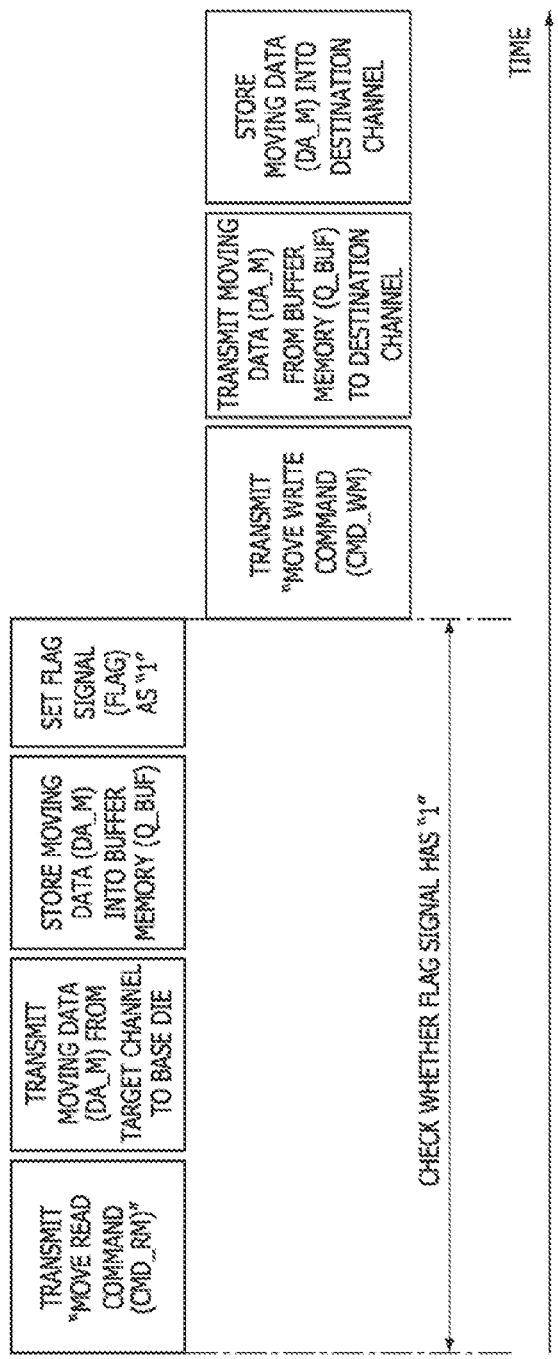
FIG. 43 illustrates data movement in the memory system illustrated in FIG. 31 relative to time.

FIG. 43 illustrates a data movement in the memory system 1000 illustrated in FIG. 31 relative to time. Referring to FIG. 43, the moving data DA_M may be stored into the buffer memory 2040 of the base die 1110 until the flag signal FLAG is set to have a binary number of "1" after the move read command CMD_RM is transmitted from the controller 1200 to the target channel and the base die 1110. The controller 1200 may check whether the flag signal FLAG is set to have a value of "1" while the moving data DA_M are stored into the buffer memory 2040 and may transmit the move write command CMD_WM after the flag signal FLAG is set to have a value of "1". Thereafter, the moving data DA_M may be transmitted from the buffer memory 2040 of the base die 1110 to the destination channel, and the moving data DA_M may be stored into the destination channel. As a result, the data move operation for the moving data DA_M may terminate. According to the present embodiment, the move write command CMD_WM may be transmitted after the flag signal FLAG is set to have a value of "1". Thus, in the buffer memory 2040, an input process of the moving data DA_M does not overlap with an output process of the moving data DA_M.

Figure 44:
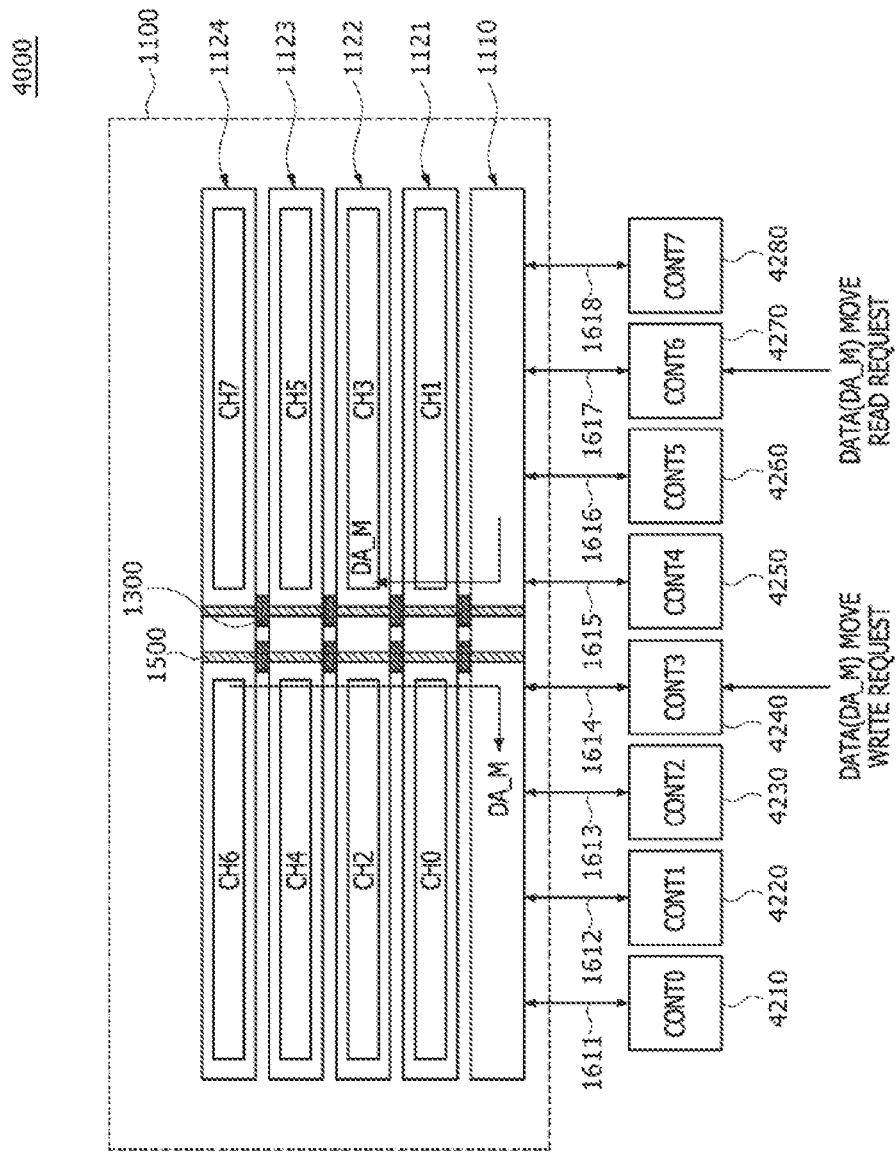
FIG. 44 illustrates a memory system according to another embodiment of the present disclosure.

FIG. 44 illustrates a memory system 4000 according to another embodiment of the present disclosure. In FIG. 44, the same reference numerals or symbols as used in FIG. 31 denote the same elements. Referring to FIG. 44, the memory system 4000 may include a stacked memory device 1100 and a plurality of controllers (e.g., first to eighth controllers (CONT0-CONT7) 4210-4280). The stacked memory device 1100 illustrated in FIG. 44 may have the same configuration as the stacked memory device 1100 described with reference to FIGS. 31 to 37. Thus, the configuration and the operation of the stacked memory device 1100 illustrated in FIG. 44 will be omitted or described briefly hereinafter to avoid duplicate explanation. In the present embodiment, the number of the plurality of controllers (i.e., the first to eighth controllers 4210-4280) may be equal to the number of the first to eighth channels CH0-CH7 of the stacked memory device 1100. The first to eighth controllers 4210-4280 may be connected to the first to eighth channels CH0-CH7, respectively, in a one-to-one relationship. For example, the first controller 4210 may communicate with the base die 1110 through the first external signal/data I/O path 1611 and may control an access operation to the first channel CH0, and the second controller 4220 may communicate with the base die 1110 through the second external signal/data I/O path 1612 and may control an access operation to the second channel CH1. Similarly, the eighth controller 4280 may communicate with the base die 1110 through the eighth external signal/data I/O path 1618 and may control an access operation to the eighth channel CH7.

In case of the memory system 4000 illustrated in FIG. 44, each of the first to eighth controllers 4210-4280 may control only an access operation to one channel. Thus, transmitting the move read command CMD_RM to the stacked memory device 1100 and transmitting the move write command CMD_WM to the stacked memory device 1100 may be executed independently during the data move operation. That is, a move read request has to be transmitted to the seventh controller 4270 controlling a target channel (e.g., the seventh channel CH6), a move write request has to be transmitted to the fourth controller 4240 controlling a destination channel (e.g., the fourth channel CH3). The move read request and the move write request may be generated by a host. As described with reference to FIG. 43, in order to prevent an operation for storing the moving data DA_M into the buffer memory 2040 of the base die 1110 from overlapping with an operation for outputting the moving data DA_M from the buffer memory 2040 of the base die 1110, the host may execute the steps 3070 to 3100 illustrated in FIG. 42 and the seventh and fourth controllers 4270 an 4240 may generate the move read command CMD_RM and the move write command CMD_WM in response to the move read request and the move write request, respectively.

Figure 45:
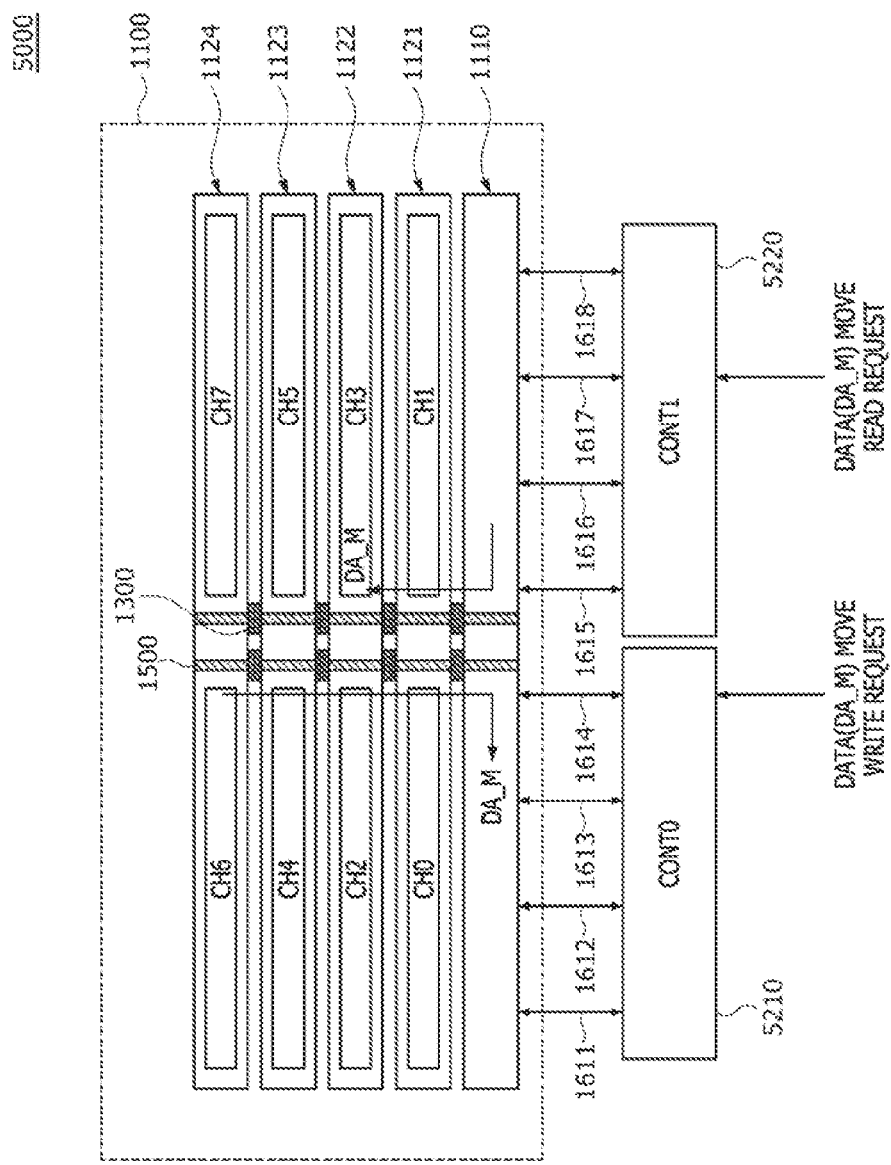
FIG. 45 illustrates a memory system according to yet another embodiment of the present disclosure.

FIG. 45 illustrates a memory system 5000 according to another embodiment of the present disclosure. In FIG. 45, the same reference numerals or symbols as used in FIG. 31 denote the same elements. Referring to FIG. 45, the memory system 5000 may include a stacked memory device 1100, a first controller (CONT0) 5210, and a second controller (CONT1) 5220. The stacked memory device 1100 illustrated in FIG. 45 may have the same configuration as the stacked memory device 1100 described with reference to FIGS. 31 to 37. Thus, the configuration and the operation of the stacked memory device 1100 illustrated in FIG. 45 will be omitted or described briefly hereinafter to avoid duplicate explanation. In the present embodiment, each of the first and second controllers 5210 and 5220 may be connected to a plurality of channels. For example, the first controller 5210 may be connected to the first to fourth channels CH0-CH3, and the second controller 5220 may be connected to the fifth to eighth channels CH4-CH7. Thus, the first controller 5210 may communicate with the base die 1110 through the first to fourth external signal/data I/O paths 1611-1614 and may control access operations to the first to fourth channels CH0-CH3, and the second controller 5220 may communicate with the base die 1110 through the fifth to eighth external signal/data I/O paths 1615-1618 and may control access operations to the fifth to eighth channels CH4-CH7.

Hereinafter, an operation of the memory system 5000 will be described in conjunction with a case that the moving data DA_M is transmitted from the seventh channel CH6 corresponding to the target channel to the fourth channel CH3 corresponding to the destination channel. Accessing to the seventh channel CH6 may be controlled by the second controller 5220, and accessing to the fourth channel CH3 may be controlled by the first controller 5210. Thus, the move read command CMD_RM transmitted to the seventh channel CH6 and the base die 1110 may be generated by the second controller 5220, and the move write command CMD_WM transmitted to the fourth channel CH3 and the base die 1110 may be generated by the first controller 5210. Thus, in such a case, as described with reference to FIG. 44, the host may be configured to transmit the move read request to the second controller 5220 and may then be configured to transmit the move write request to the first controller 5210 after the moving data DA_M are stored into the buffer memory 2040 included in the base die 1110. Although not shown in the drawings, in the event that both of the target channel and the destination channel are controlled by any one of the first and second controllers 5210 and 5220, an operation for controlling the data transmission may be the same as the operation described with reference to FIGS. 38 to 42.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
a stacked memory device including a base die and a plurality of memory dies stacked on the base die, wherein each of the plurality of memory dies has a plurality of channels, and wherein the base die is configured to function as an interface for transmitting signals and data of a multiplicity of channels including the plurality of channels for each of the memory dies; and
a controller configured to control the stacked memory device such that a first data move control operation and a second data move control operation are sequentially performed in the stacked memory device to transmit moving data from a target channel of the multiplicity of channels to a destination channel of the multiplicity of channels,
wherein the first data move control operation is performed to store the moving data in the target channel into the base die, and
wherein the second data move control operation is performed to write the moving data stored in the base die into the destination channel.

2. The memory system of claim 1,
wherein each of the plurality of memory dies and the base die includes at least one through electrode; and
wherein the stacked memory device is configured such that at least one of the plurality of memory dies communicates with the base die via the through electrodes of the underlying memory dies.

3. The memory system of claim 1, wherein each of the plurality of channels included in each of the plurality of memory dies includes a plurality of memory banks.

4. The memory system of claim 1, wherein each of the plurality of channels included in each of the plurality of memory dies includes a plurality of memory banks and a plurality of arithmetic circuits.

5. The memory system of claim 4, wherein each of the plurality of arithmetic circuits is configured to receive weight data and vector data from a first memory bank and a second memory bank, respectively, of the plurality of memory banks and is configured to perform an arithmetic operation for the weight data and the vector data to generate and output arithmetic result data.

6. The memory system of claim 1, wherein each of the plurality of channels included in each of the plurality of memory dies includes a plurality of memory banks, a plurality of arithmetic circuits, and a global buffer.

7. The memory system of claim 6, wherein each of the plurality of arithmetic circuits is configured to receive weight data and vector data from one of the plurality of memory banks and the global buffer and is configured to perform an arithmetic operation for the weight data and the vector data to generate and output arithmetic result data.

8. The memory system of claim 1, wherein the base die includes:
a plurality of internal signal/data transmission paths coupled to respective channels of the multiplicity of channels;
a plurality of physical layers coupled to respective ones of the plurality of internal signal/data transmission paths to function as interfaces for transmission of signal/data between the controller and the base die; and
buffer memory selectively coupled to at least one of the plurality of internal signal/data transmission paths,
wherein the buffer memory is configured to store the moving data, which are outputted from the target channel, during the first data move control operation and is configured to output the moving data during the second data move control operation.

9. The memory system of claim 8, further comprising:
a global channel input/output (I/O) line connected to the buffer memory; and
a plurality of switches,
wherein first terminals of the plurality of switches are connected to the plurality of internal signal/data transmission paths, respectively, and
wherein all of second terminals of the plurality of switches are connected to the global channel I/O line.

10. The memory system of claim 9,
wherein the switch coupled between the internal signal/data transmission path connected to the target channel and the global channel I/O line among the plurality of switches is selectively switched on during the first data move control operation; and
wherein the switch coupled between the internal signal/data transmission path connected to the destination channel and the global channel I/O line among the plurality of switches is selectively switched on during the second data move control operation.

11. The memory system of claim 9, wherein the buffer memory includes:
a data storage part having a plurality of data storage regions in which the moving data are stored;
an identification (ID) part configured to identify each of the plurality of data storage regions; and
an I/O part configured to control a data transmission direction between the global channel I/O line and the ID part.

12. The memory system of claim 11,
wherein the ID part includes a plurality of transfer gates which are connected to respective ones of the plurality of data storage regions and which are connected to the I/O part; and
wherein one of the plurality of transfer gates is selectively enabled by an identification signal outputted from the controller.

13. The memory system of claim 11, wherein the I/O part includes:
a first tri-state inverter having an input terminal connected to the global channel I/O line, an output terminal connected to the ID part, and a control signal input terminal for receiving a move read command from the controller; and
a second tri-state inverter having an input terminal connected to the ID part, an output terminal connected to the global channel I/O line, and a control signal input terminal for receiving a move write command from the controller.

14. The memory system of claim 1, wherein the controller includes:
a read queue block configured to store a read request and a move read request outputted from a host;
a write queue block configured to store a write request and a move write request outputted from the host; and
a command generator configured to receive a queue from the read queue block or the write queue block to generate a command, an address, and an identification signal corresponding to the queue.

15. The memory system of claim 14,
wherein the read queue block includes a plurality of read queue entries;
wherein a first read queue entry of the plurality of read queue entries includes a read command and a first address which correspond to the read request; and
wherein a second read queue entry of the plurality of read queue entries includes a move read command, a second address, a first flag signal, and the identification signal which correspond to the move read request.

16. The memory system of claim 15,
wherein the write queue block includes a plurality of write queue entries;
wherein a first write queue entry of the plurality of read queue entries includes a write command, a third address, and write data which correspond to the write request; and
wherein a second write queue entry of the plurality of read queue entries includes a move write command, a fourth address, a second flag signal, and the identification signal which correspond to the move write request.

17. The memory system of claim 16,
wherein the command generator is configured to output the move read command, the second address, and the identification signal for the first data move control operation in response to the move read request outputted from the read queue block; and
wherein the command generator is configured to output the move write command, the fourth address, and the identification signal for the second data move control operation in response to the move write request outputted from the write queue block.

18. The memory system of claim 17,
wherein the base die includes buffer memory which is configured to store the moving data outputted from the target channel during the first data move control operation and which is configured to output the moving data during the second data move control operation;
wherein the move read command generated by the command generator is transmitted to the target channel and the buffer memory;
wherein the second address generated by the command generator is transmitted to the target channel; and
wherein the identification signal generated by the command generator is transmitted to the buffer memory.

19. The memory system of claim 18,
wherein the move write command generated by the command generator is transmitted to the destination channel and the buffer memory;
wherein the fourth address generated by the command generator is transmitted to the destination channel; and
wherein the identification signal generated by the command generator is transmitted to the buffer memory.

20. The memory system of claim 16,
wherein the base die includes buffer memory which is configured to store the moving data outputted from the target channel during the first data move control operation and which is configured to output the moving data during the second data move control operation;

wherein the controller is configured to set the first and second flag signals to a first level of multiple levels if the moving data are stored into the buffer memory by the first data move control operation.

21. The memory system of claim 20, wherein the controller is configured to perform the second data move control operation while the second flag signal is set to have the first level.

22. The memory system of claim 1, further comprising a plurality of external signal/data transmission paths coupled between the base die and the controller, wherein the base die includes a plurality of internal signal/data transmission paths connected to respective ones of the plurality of channels; and wherein the plurality of external signal/data transmission paths are connected to the plurality of internal signal/data transmission paths, respectively.

23. The memory system of claim 22, wherein the controller comprises a plurality of controllers; and wherein each of the plurality of controllers is configured to access one of the plurality of channels through one of the plurality of external signal/data transmission paths.

24. The memory system of claim 22, wherein the controller comprises a plurality of controllers; and wherein each of the plurality of controllers is configured to access at least two of the plurality of channels through at least two of the plurality of external signal/data transmission paths.

* * * * *